(12) United States Patent
Den et al.

(10) Patent No.: US 8,212,252 B2
(45) Date of Patent: *Jul. 3, 2012

(54) LIGHT-EMITTING DEVICE

(75) Inventors: Tohru Den, Tokyo (JP); Tatsuya Iwasaki, Tokyo (JP); Hideo Hosono, Yokohama (JP); Toshio Kamiya, Yokohama (JP); Kenji Nomura, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/882,628

(22) Filed: Sep. 15, 2010

(65) Prior Publication Data
US 2011/0017996 A1    Jan. 27, 2011

Related U.S. Application Data

(62) Division of application No. 11/269,768, filed on Nov. 9, 2005, now Pat. No. 7,872,259.

(30) Foreign Application Priority Data

Nov. 10, 2004 (JP) .................................. 2004-326684

(51) Int. Cl.
*H01L 31/20* (2006.01)
(52) U.S. Cl. ............... 257/59; 257/52; 257/55; 257/56; 257/62; 257/72; 257/E29.083; 257/E29.092; 257/E29.101

(58) Field of Classification Search .................. 257/52, 257/55–57, 62, 72, E29.083, E29.092, E29.101
See application file for complete search history.

(56) References Cited

U.S. PATENT DOCUMENTS

| | | | |
|---|---|---|---|
| 6,075,256 A | 6/2000 | Kaifu et al. | 257/53 |
| 6,909,114 B1 | 6/2005 | Yamazaki | 257/66 |
| 7,189,992 B2 | 3/2007 | Wager, III et al. | 257/43 |
| 7,791,072 B2 | 9/2010 | Kumomi et al. | 257/59 |
| 7,872,259 B2 * | 1/2011 | Den et al. | 257/59 |
| 2003/0215266 A1 | 11/2003 | Ishida et al. | 399/223 |

(Continued)

FOREIGN PATENT DOCUMENTS
EP          1324156       7/2003
(Continued)

OTHER PUBLICATIONS

Korean Office Action dated Oct. 28, 2009 issued in the counterpart application No. 10-2009-7016244 (3 pages).

(Continued)

*Primary Examiner* — Minchul Yang
(74) *Attorney, Agent, or Firm* — Fitzpatrick, Cella, Harper & Scinto

(57) ABSTRACT

An object of the present invention is to provide a new light-emitting device with the use of an amorphous oxide. The light-emitting device has a light-emitting layer existing between first and second electrodes and a field effect transistor, of which the active layer is an amorphous.

54 Claims, 8 Drawing Sheets

U.S. PATENT DOCUMENTS

| | | | |
|---|---|---|---|
| 2003/0218222 A1 | 11/2003 | Wager, III et al. | 257/410 |
| 2004/0155846 A1 | 8/2004 | Hoffman et al. | 345/87 |
| 2005/0039670 A1 | 2/2005 | Hosono et al. | |
| 2005/0173734 A1 | 8/2005 | Yoshioka et al. | 257/202 |
| 2005/0199959 A1 | 9/2005 | Chiang et al. | 257/368 |
| 2005/0275038 A1 | 12/2005 | Shih et al. | 257/382 |
| 2006/0108636 A1 | 5/2006 | Sano et al. | 257/347 |
| 2006/0113539 A1 | 6/2006 | Sano et al. | 257/59 |
| 2006/0113565 A1 | 6/2006 | Abe et al. | 257/197 |
| 2007/0194379 A1 | 8/2007 | Hosono et al. | |
| 2007/0231721 A1 | 10/2007 | Nukada et al. | 430/66 |
| 2009/0278122 A1 | 11/2009 | Hosono et al. | |
| 2009/0280600 A1 | 11/2009 | Hosono et al. | |
| 2011/0101352 A1 | 5/2011 | Hosono et al. | |
| 2011/0201162 A1 | 8/2011 | Hosono et al. | |
| 2012/0012838 A1 | 1/2012 | Hosono et al. | |

FOREIGN PATENT DOCUMENTS

| | | |
|---|---|---|
| JP | 05-251705 | 9/1993 |
| JP | 08-032094 | 2/1996 |
| JP | 2000-44236 | 2/2000 |
| JP | 2000-238332 | 9/2000 |
| JP | 2002-289859 | 10/2002 |
| JP | 2002-319682 | 10/2002 |
| JP | 2003-37268 | 2/2003 |
| JP | 2003-282256 | 10/2003 |
| JP | 2003-298062 | 10/2003 |
| JP | 2004-103957 | 4/2004 |
| WO | WO 03/098699 | 11/2003 |
| WO | WO 2004/038757 | 5/2004 |
| WO | WO 2005/088726 | 9/2005 |
| WO | WO 2005/093846 A1 | 10/2005 |
| WO | WO 2005/093847 A1 | 10/2005 |
| WO | WO 2005/093848 A1 | 10/2005 |
| WO | WO 2005/093849 A1 | 10/2005 |
| WO | WO 2005/093850 A1 | 10/2005 |
| WO | WO 2005/093851 A1 | 10/2005 |
| WO | WO 2005/093852 A1 | 10/2005 |
| WO | WO 2006/051993 | 5/2006 |
| WO | WO 2006/051994 | 5/2006 |
| WO | WO 2006/051995 | 5/2006 |

OTHER PUBLICATIONS

Notification of the First Office Action for Chinese Application No. 200580038303.1, issued by the Patent Office of the People's Republic of China, dated Sep. 5, 2008.

Narushima et al., "A p-Type Amorphous Oxide Semiconductor and Room Temperature Fabrication of Amorphous Oxide p-n Heterojunction Diodes", *Advanced Materials*, vol. 15, No. 17, pp. 1409-1413 (2003).

Orita, et al.; Philosophical Magazine B, 2001, vol. 81, No. 5, pp. 501-515.

Nomura et al., "Room-temperature Fabrication of Transparent Flexible Thin-film Transistors Using Amorphous Oxide Semiconductors," *Nature*, vol. 432, 488-492 (2004).

Takagi et al., "Carrier Transport and Electronic Structure in Amorphous Oxide Semiconductor, a-InGaZnO$_4$," *Thin Solid Films*, vol. 486, 38-41 (2005).

Nomura et al., "Thin-Film Transistor Fabricated in Single-Crystalline Transparent Oxide Semiconductor," *Science*, vol. 300, 1269-1272 (2003).

Nomura et al., "Carrier Transport in Transparent Amorphous Oxide Semiconductor InGaZnO$_4$", Preprint 31a-ZA-6 of 51th Meeting of Union of Applied Phys. Soc., Mar. 2004, Tokyo University of Technology.

Kamiya et al., "Room Temperature Fabrication and Carrier Transport . . . (>10 cm$^2$/Vs)", Preprint 1a-F-5 of 65th Meeting of Appl. Phys. Soc., Sep. 2004, Tohoku Gakuen University.

Canadian Office Action dated Jan. 25, 2011, issued in Canadian Application No. 2,585,063—3 pages.

T. Kamiya, et al., "Room temperature fabrication and carrier transport of amorphous semiconductor exhibiting large electron Hall mobilities > 10 cm2/Vs", The 65th Autumn Meeting, The Japan Society of Applied Physics, No. 2, p. 791, abstract 1a-F-5 (2004) with English translation.

* cited by examiner

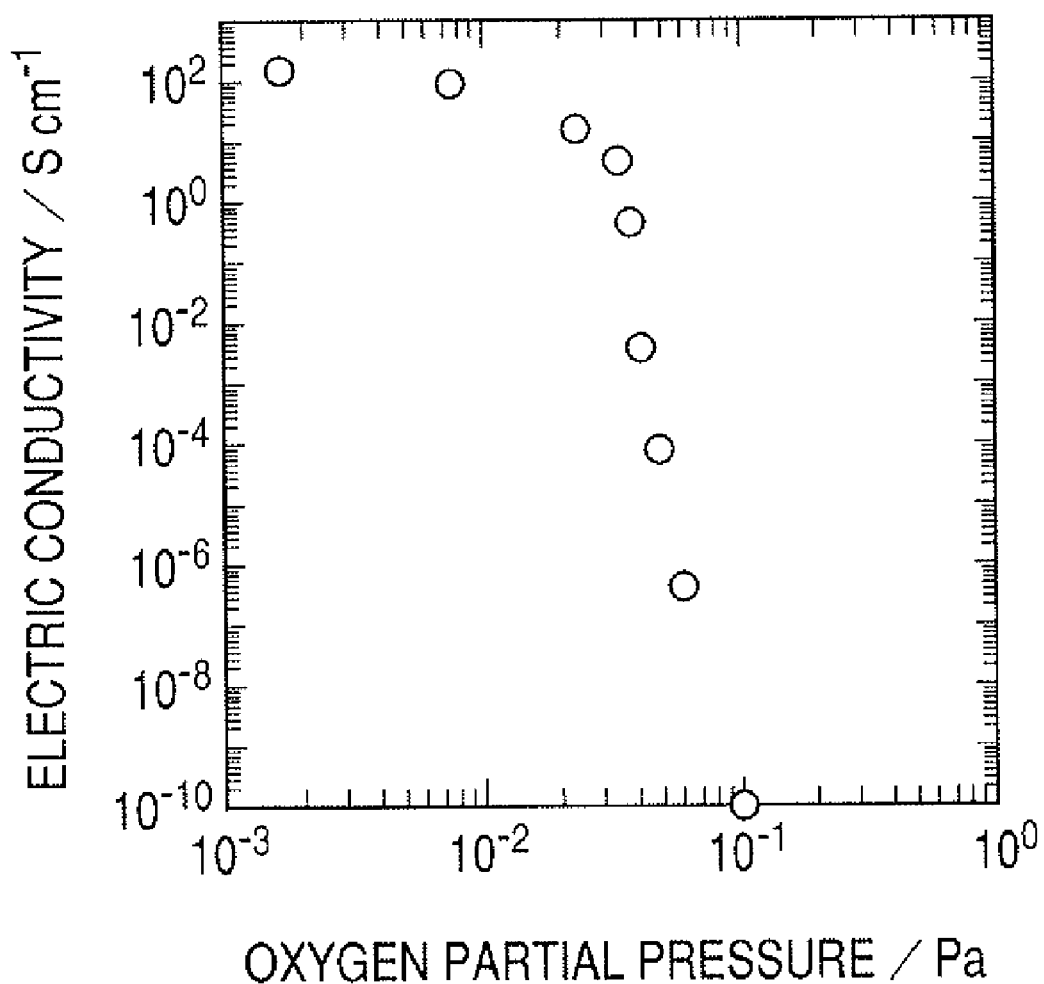

X in $InGaZn_{1-x}Mg_xO_4$

LIGHT-EMITTING DEVICE

CROSS-REFERENCE TO RELATED APPLICATION

This application is a division of U.S. patent application Ser. No. 11/269,768, filed on Nov. 9, 2005, now U.S. Pat. No. 7,872,259 which claims the benefit of Japanese Patent Application No. 2004-326684, filed on Nov. 10, 2004. The contents of the aforementioned applications are incorporated herein by reference in their entireties.

BACKGROUND OF THE INVENTION

1. Field of the Invention

The present invention relates to a light-emitting device using an oxide, and particularly using an organic EL element and an inorganic EL element. The light-emitting device according to the present invention also relates to a top emission type or a bottom emission type.

2. Related Background Art

In recent years, a flat panel display (FPD) is in practical use as a result of the progress of technologies relating to a liquid crystal and electroluminescence (EL). The FPD is driven by an active matrix circuit consisting of a field effect thin film transistor (TFT) using an amorphous silicon thin film or a polycrystalline silicon thin film provided on a glass substrate as an active layer.

On the other hand, an attempt has been made to use a lightweight and flexible resin substrate in place of the glass substrate, in quest of further improvement in thinning, slimming and breakage resistance of an FPD. However, because a thermal process in a comparatively high temperature is necessary to manufacture a transistor with the use of the above described silicon thin film, it is difficult to directly form the silicon thin film on a resin substrate with low heat resistance.

For this reason, a TFT using an oxide semiconductor thin film mainly containing ZnO for instance, which can be film-formed at a low temperature, has been actively developed (Japanese Patent Application Laid-Open No. 2003-298062).

However, the TFT using a conventional oxide-semiconductor thin film does not reach a technical level of developing the applied technology, probably because of not having attained sufficient characteristics such as in a TFT using silicon.

SUMMARY OF THE INVENTION

An object of the present invention is to provide the new light-emitting device, an electronograph and a display unit, which employ a transistor using an oxide as an active layer.

According to an aspect of the present invention, there is provided a light-emitting device having a light-emitting element comprising first and second electrodes and a light-emitting layer existing between the first and second electrodes, and a field effect transistor for driving the light-emitting element, wherein
the active layer of the field effect transistor is formed of an amorphous oxide having an electronic carrier concentration of less than $10^{18}/cm^3$.

The amorphous oxide preferably includes at least one of In, Zn and Sn.

Alternatively, the amorphous oxide is preferably any one selected from the group consisting of an oxide containing In, Zn and Sn; an oxide containing In and Zn; an oxide containing In and Sn; and an oxide containing In.

Alternatively, the amorphous oxide preferably includes In, Zn and Ga.

The light-emitting element and the field effect transistor are preferably arranged on an optically transparent substrate, and a light emitted from the light-emitting layer is output through the substrate. The field effect transistor is preferably arranged between the substrate and the light-emitting layer.

Alternatively, the light-emitting element and the field effect transistor are preferably arranged on an optically transparent substrate, and a light emitted from the light-emitting layer is output through the substrate and the amorphous oxide. The field effect transistor is preferably arranged between the substrate and the light-emitting layer.

In the light-emitting device, at least one of the drain electrode of the field effect transistor and the second electrode is preferably formed of an optically transparent electroconductive oxide.

The light-emitting element is preferably an electroluminescent element.

In the light-emitting device, a plurality of the light-emitting elements are preferably arranged at least in a single row. The light-emitting element is preferably arranged so as to be adjacent to the field effect transistor.

According to another aspect of the present invention, there is provided an electrophotographic device having
a photoreceptor,
an electrifier for electrifying the photoreceptor,
an exposing light source for exposing the photoreceptor in order to form a latent image on the photoreceptor, and
a developing unit for developing the latent image, wherein
the exposing light source has the light-emitting device.

According to a still another aspect of the present invention, there is provided a light-emitting device having a light-emitting element comprising first and second electrodes and a light-emitting layer existing between the first and second electrodes, and a field effect transistor for driving the light-emitting element, wherein wherein an electron mobility of an active layer of the field effect transistor tends to increase with increasing electron carrier concentration.

According to a further aspect of the present invention, a light-emitting device having a light-emitting element comprising first and second electrodes and a light-emitting layer existing between the first and second electrodes, and a field effect transistor for driving the light-emitting element, wherein
the active layer of the field effect transistor includes such a transparent amorphous-oxide semiconductor as to be capable of realizing a normally off state. The transparent amorphous-oxide semiconductor preferably has an electronic carrier concentration of less than $10^{18}/cm^3$, which is sufficiently few in realizing the normally off state.

According to a further aspect of the present invention, an active matrix display device comprising a light-emitting element comprising first and second electrodes and a light-emitting layer existing between the first and second electrodes and a field effect transistor for driving the light-emitting element, and a picture element circuit arranged into a two-dimensional matrix form, wherein
the active layer of the field effect transistor includes such a transparent amorphous-oxide semiconductor as to be capable of realizing a normally off state. The transparent amorphous-oxide semiconductor preferably has an electronic carrier concentration of less than $10^{18}/cm^3$, which is sufficiently few in realizing the normally off state.

According to a further aspect of the present invention, there is provided a display article comprising;

a light-emitting element comprising first and second electrodes and a light-emitting layer existing between the first and second electrodes and a field effect transistor for driving the light-emitting element, wherein an active layer of the field effect transistor includes an amorphous oxide semiconductor.

The amorphous oxide is preferably any one selected from the group consisting of an oxide containing In, Zn and Sn; an oxide containing In and Zn; an oxide containing In and Sn; and an oxide containing In.

Alternatively, the transistor is preferably a normally-off type transistor.

The present invention can provide a new light-emitting device, electronograph and active matrix display unit.

As a result of having studied a ZnO oxide semiconductor, the present inventors found that a general process can not form a stable amorphous phase. Furthermore, it seemed that most of generally produced ZnO presents a polycrystal phase, scatters carriers at interfaces between polycrystal grains, and consequently cannot increase electron mobility. In addition, ZnO tends to form oxygen defects, consequently produces many carrier electrons, and has difficulty in decreasing electric conductivity. For this reason, it was found that a TFT using the ZnO semiconductor passes a large current between a source terminal and a drain terminal even when a gate voltage of a transistor is not applied, and can not realize a normally off operation. It also seems that the TFT using the ZnO semiconductor has difficulty in increasing an ON/OFF ratio.

Furthermore, the present inventors have studied on an amorphous oxide film $Zn_xM_yIn_zO_{(x+3y/2+3z/2)}$ (wherein M is at least one element of Al and Ga), described in Japanese Patent Application Laid-Open No. 2000-044236. The material has an electronic carrier concentration of $1\times10^{18}/cm^3$ or more, and accordingly is suitable for being used simply as a transparent electrode. However, it was found that the material is not suitable for a normally off type of a TFT, because when the TFT employs an oxide with the electronic carrier concentration of $1\times10^{18}/cm^3$ or more for its channel layer, the TFT can not provide a sufficient ON/OFF ratio.

In other words, a conventional amorphous oxide film could not obtain an electronic carrier concentration of less than $1\times10^{18}/cm^3$.

The present inventors have energetically researched the properties of $InGaO_3(ZnO)_m$ and a film-forming condition for the material, and as a result, have found that electronic carrier concentration can be reduced to less than $1\times10^{18}/cm^3$ by controlling the condition of oxygen atmosphere during forming the film.

Consequently, the present inventors found that a TFT prepared by using an amorphous oxide containing electronic carriers with a concentration of less than $1\times10^{18}/cm^3$ as an active layer of a field effect transistor can show desired characteristics, and can be applied to a flat panel display such as a light-emitting device.

As for an electronograph provided with a linearly arrayed light source and a photoreceptor using a light-emitting device according to the present invention, there are a copying machine, a page printer and an integral drum cartridge.

BRIEF DESCRIPTION OF THE DRAWINGS

FIG. 3 is a diagrammatic drawing showing a relationship between the number of electronic carriers and electron mobility in an In—Ga—Zn—O-based amorphous film formed with a pulsed laser vapor deposition method;

DESCRIPTION OF THE PREFERRED EMBODIMENTS

Figure 1:
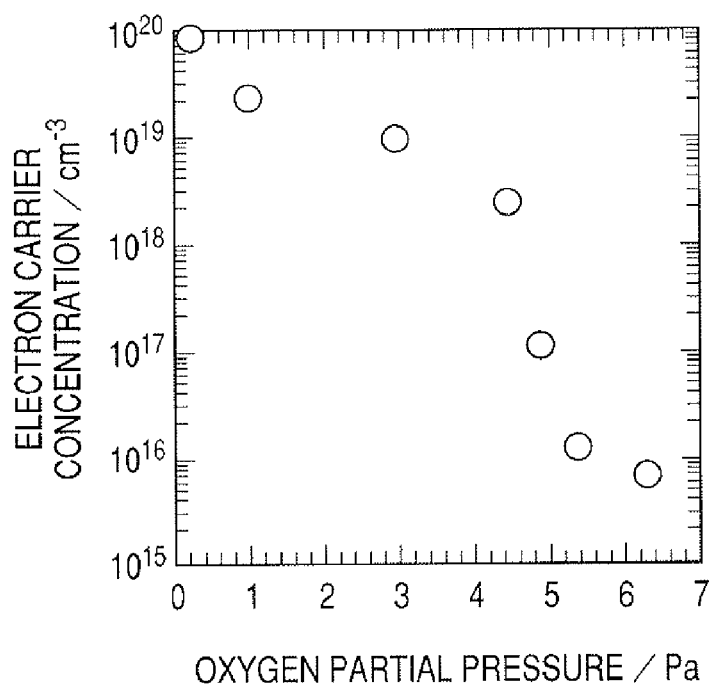
FIG. 1 is a diagrammatic drawing showing a relationship between electronic carrier concentration in an In—Ga—Zn—O-based amorphous film formed with a pulsed laser vapor deposition method and a oxygen partial pressure while the film is being formed.

A basic configuration according to the present invention will be now described with reference to FIG. 7 which shows the first embodiment.

In the drawing, numerical character 70 denotes a drain electrode, numerical character 71 a substrate, numerical character 72 an active layer, numerical character 73 a gate insulation film, numerical character 74 a gate electrode, numerical character 75 a source electrode, numerical character 77 a second electrode, numerical character 78 a light-emitting layer and numerical character 79 a first electrode. In the first embodiment, the second electrode (hereafter called a "bottom electrode") is arranged nearer to a substrate than a light-emitting layer is, the light-emitting layer is an organic EL layer, and the first electrode (hereafter called a "counter electrode") is arranged more distant from the substrate than the light-emitting layer is. Gaps between the above described components are filled with an interlayer insulation layer 76.

At first, each component will be described in detail.

(1. Substrate)

Glass is generally used for a material of a substrate in a light-emitting device. However, because a TFT used in the present invention can be formed at a low temperature, a plastic substrate which has been difficult to be used in an active matrix can be used in the present invention. Thereby, the light-emitting device can be provided which is lightweight, is hardly damaged and bendable to some extent. As a matter of course, a semiconductor substrate such as Si and a ceramic substrate can be used. A substrate having an insulation layer provided on a metallic base plate can also be used as long as the substrate is flat.

(2. Transistor)

An active layer of a transistor may be any material as long as it has desired characteristics, specifically, an electronic carrier concentration of less than $1 \times 10^{18}/cm^3$ and an electron mobility of more than 1 $cm^2/(V\text{-second})$. The material includes, for instance, an In—Ga—Zn—O-based amorphous-oxide semiconductor. The amorphous oxide is a transparent film. Here, the word, transparence, not only means the case of being substantially transparent for visible light, but also includes the case of being optically transparent for at least one part of light in a visible range. As for the optical transparency, the In—Ga—Zn—O-based amorphous-oxide semiconductor preferably has a transmittance of 50% or higher, and more preferably of 80% or higher. The above composition can contain substituted or added Mg. When a light-emitting device employs a TFT using the In—Ga—Zn—O-based active layer, it shows a useful performance, because the TFT supplies a sufficient driving force of both voltage and current to an organic EL element.

The amorphous oxide will be separately described in detail.

A sputtering technique and a pulsed laser vapor deposition method are suitable for forming an active layer as was described above, but such various sputtering techniques as to have an advantage in productivity are preferable. It is also effective to appropriately interpose a buffer layer between the active layer and the substrate.

As a gate insulation film, any one of $Al_2O_3$, $Y_2O_3$ and $HfO_2$, or a mixed crystal compound containing at least two or more compounds thereof is preferable, but may be another compound.

A usable source electrode and drain electrode include an electroconductive oxide represented by ITO and a metal such as Au. However, the electrode preferably can be ohmically or nearly ohmically connected with an active layer. The drain electrode may also be directly connected with a light-emitting layer without bypassing a second electrode.

(3. Light-Emitting Layer)

A light-emitting layer is not limited as long as it can be driven by a TFT, but an organic EL is particularly advantageous. The organic EL layer 78 used in the present invention is rarely used as a single layer, but is often used in a configuration consisting of a plurality of layers, as is shown in the following. In the following, an "electron transport layer" means a light-emitting layer having an electron-transporting function.

hole transport layer/light-emitting layer+electron transport layer hole transport layer/light-emitting layer/electron transport layer hole injection layer/hole transport layer/light-emitting layer/electron transport layer hole injection layer/hole transport layer/light-emitting layer/electron transport layer/electron injection layer An electron barrier layer and an adhesion improvement layer are occasionally interposed between a plurality of the layers.

In general, there are two principles of fluorescence and phosphorescence in a light-emitting principle of a light-emitting layer, but the phosphorescence is effective from a viewpoint of luminous efficiency. An iridium complex is useful as a phosphorescent material. Both of a low molecule polymer and a high molecule polymer can be used as a polymer used in a base metal for the light-emitting layer. When the low molecule polymer is employed, the light-emitting layer can be generally formed with a vapor deposition technique, and when the high molecule polymer is employed, the light-emitting layer with an ink jet method or a printing process can be formed. For example, the low MW (Molecular Weight) materials include an amine complex, anthracene, a rare earth complex and a noble metal complex; and the high MW materials includes a $\pi$ conjugate polymer and a pigment-containing polymer.

An electron injection layer includes an alkali metal, an alkaline earth metal, a compound thereof, and an organic layer doped with an alkali metal. In addition, an electron transport layer includes an aluminum complex, oxadiazole, triazole and phenanthroline.

A hole injection layer includes arylamines, phthalocyanines and an organic layer doped with a Lewis acid; and a hole transport layer includes arylamine.

Figure 7:
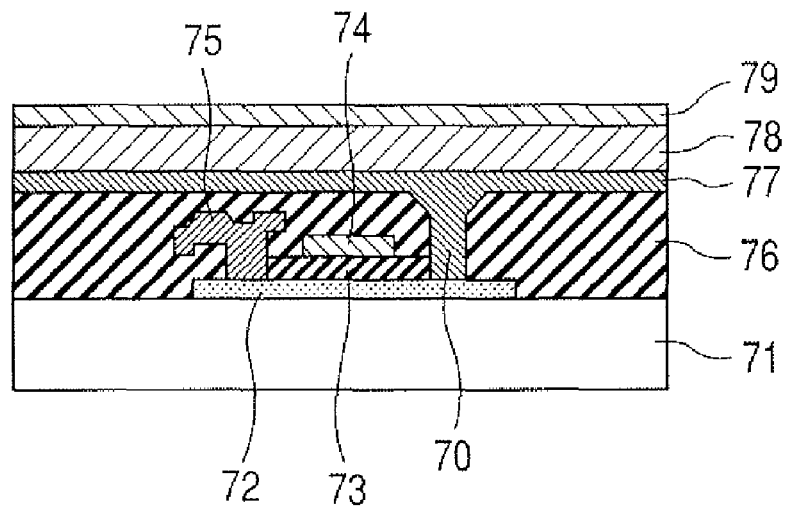
FIG. 7 is a schematic block diagram showing a cross section of a light-emitting device according to the present invention.

By the way, FIG. 7 shows a configuration example of an organic EL element, but the same configuration can be used for an inorganic EL element.

(4. First Electrode)

A first electrode will be described for the case of being a counter electrode. A preferred material for the counter electrode differs depending on whether it is used in a top emission type or a bottom emission type, and is used as a cathode or an anode.

When a counter electrode is used in a top emission type, transparency is required; and when it is used as an anode, a usable material includes ITO, electroconductive tintintin oxide, electroconductive ZnO and In—Zn—O and In—Ga—Zn—O-based oxide having an electronic carrier concentration of $1 \times 10^{18}/cm^3$ or more, which are all transparent electroconductive oxides. When it is used as a cathode, the counter electrode can be formed by forming an alloy doped with an alkali metal or an alkaline earth metal into a film with several tens of nanometers or thinner and forming the transparent electroconductive oxide on the upper part.

When it is used in a bottom emission type, transparency is not needed, so that when it is used as an anode, an Au alloy and a Pt alloy are usable for it, and when it is used as a cathode, Ag-added Mg, Li-added Al, a silicide, a boride and a nitride can be used.

(5. Second Electrode)

A second electrode is connected to a drain electrode. The second electrode may have the composition as or a different composition from that of the drain electrode.

The second electrode may be a bottom electrode. The bottom electrode may be formed in a layer form along a substrate or a light-emitting layer.

When a light-emitting layer is a current injection type as is represented by an organic EL element, there is a preferred bottom electrode according to the configuration.

When a light-emitting layer connected to a bottom electrode is a cathode, the bottom electrode preferably is a metal having a small work function. The bottom electrode includes, for instance, Ag-added Mg, Li-added Al, a silicide, a boride and a nitride. In this case, it is more advantageous to be connected with a drain part of a TFT through wiring than to be directly connected with it.

When a light-emitting layer connected to a bottom electrode is an anode, the bottom electrode preferably is a metal having a large work function. The bottom electrode includes, for instance, ITO, electroconductive tintin oxide, electroconductive ZnO, In—Zn—O, a Pt alloy and an Au alloy. In addition, In—Ga—Zn—O-based oxide with an electronic carrier concentration of $1\times10^{18}/cm^3$ or higher can be used. In this case, the higher is the carrier concentration, the more preferable as the bottom electrode is the oxide, which is different from the case used for a TFT. For instance, the carrier concentration of $1\times10^{19}/cm^3$ or more is preferable. When the bottom electrode is made of ITO or In—Ga—Zn—O based oxide (with high carrier concentration), it can provide a high open-area ratio even if being employed in a bottom emission type, because of being transparent. When the bottom electrode is directly connected with a drain electrode, particularly ITO, the above described In—Ga—Zn—O based oxide (with high carrier concentration) and an Au alloy are particularly preferable for it.

When a bottom electrode is directly connected with a drain electrode, the bottom electrode is preferably a hole injection type. Particularly preferable materials for the bottom electrode are ITO, ZnO doped with Al or Ga, and In—Ga—Zn—O-based oxide with a carrier concentration of $1\times10^{18}/cm^3$ or more. Particularly, when the In—Ga—Zn—O-based oxide is employed as an electrode and an active layer, the carrier concentration of a part of an active layer In—Ga—Zn—O can be increased by a technique of introducing oxygen defect therein, or the like, the light-emitting device is simply and effectively configured. In this case, at a glance, a hole transport layer and a hole injection layer are formed on the active layer. This configuration shall be in a range of the present invention. Specifically, it means the configuration in which the bottom electrode and the drain electrode are integrated with one part of the active layer.

(6. Interlayer Insulation Layer)

Particularly, when a second electrode is a bottom electrode, an interlayer insulation layer 76 considered to be an underlayer of the bottom electrode 77 can employ the very same material as in a gate insulation film. As a matter of course, the insulation layer with the use of the other material can be formed in order to obtain a flat layer. For instance, a polyimide film can be spin-coated, and silicon oxide can be formed with a plasma CVD method, a PECVD method and a LPCVD method or by coating and baking siliconalkoxide. The interlayer insulation layer needs to appropriately have a contact hole for connection to a source electrode or a drain electrode formed therein.

(7. Electrode Wire and Others)

An electrode wire such as a scan electrode wire and a signal electrode wire which are a gate electrode wire can employ a metal such as Al, Cr and W and silicide such as WSi as the material.

In the next place, a relationship among each of components will be described in detail.

At first, a first embodimentembodiment will be described with reference to FIG. 7, in which a bottom electrode is partially connected with a drain electrode by wiring.

First Embodimentembodiment

A source electrode 75 and a drain electrode 70 are directly connected with an active layer 72, and the current passing through the active layer 72 is controlled by a gate electrode 74 through a gate insulation film 73.

An organic EL layer 78 of a light-emitting layer is connected with a drain electrode 70, through a bottom electrode 77 and a wire in a contact hole. An interlayer insulation layer 76 exists between the bottom electrode 77 and a TFT section to electrically insulate them. The interlayer insulation layer 76 does not necessarily need to be a single layer, but generally consists of insulation layers arranged on the gate insulation film and on the upper part of the gate electrode, and the general interlayer insulation layer for a flattening purpose.

A counter electrode 79 exists on the upper part of the organic EL layer 78, and applies voltage to the organic EL layer 78 to make it emit light when a TFT is turned ON.

Here, a drain electrode 70 is electrically connected with a second electrode, or is the second electrode in itself.

FIG. 7 shows an example of a high open-area ratio in which an organic EL layer 78 exists even on the top of a TFT, but the organic EL layer 78 may be formed on other parts than a TFT part, as long as it does not causes problem with application. However, when the organic EL layer 78 is used in a configuration shown by FIG. 7, a lower part of the organic EL layer 78 is preferably as flat as possible.

Although drain electrode 70 is connected to bottom electrode 77 in FIG. 7, source electrode 75 is connected to bottom electrode 77, depending on a manner of the use. That is, the present invention is characterized in connecting any one of the source electrode and the drain electrode of a transistor containing an amorphous oxide to an electrode sandwiching a light-emitting layer. In case that bottom electrode 77 under the light-emitting layer 78 is an anode, a constitution wherein a source electrode of the TFT is connected to the anode is also preferable.

(About Preparation of Light-Emitting Device)

Here, a process for manufacturing a light-emitting device according to the present invention will be described, with reference to an example of the configuration in which a drain electrode is connected with a bottom electrode through wiring, and an organic EL is employed as a light-emitting element.

(Preparation of Transistor)

A transistor is prepared by the steps of: depositing a thin film of an In—Ga—Zn—O-based amorphous-oxide semiconductor on a glass substrate into a thickness of 120 nm with a pulsed laser vapor deposition method, in such a condition as to make the electron carrier concentration into $1\times10^{18}/cm^3$, which will be described in detail later, while using a polycrystal sintered compact having the composition of $InGaO_3(ZnO)_4$ as a target;

further layering the film of $InGaO_3(ZnO)_4$ with high electroconductivity thereon into the thickness of 30 nm with the pulsed laser deposition method in a chamber having an oxygen partial pressure controlled to less than 1 Pa, and forming the film of Au thereon into the thickness of 50 nm as a source electrode and a drain electrode with an electron beam vapor deposition method; and further forming each film of $Y_2O_3$ as a gate insulation film and of Au as a gate electrode into the thickness of respectively 90 nm and 50 nm with the electron beam vapor deposition method. In a series of the above described processes, each layer is formed into a desired size with a photolithographic method and a lift-off technology. Furthermore, an insulation layer is formed on them with a similar method. Then, a contact hole for a drain electrode is also formed therein.

(Preparation of Bottom Electrode Layer)

After that, a bottom electrode is formed by forming the film of ITO into the thickness of 300 nm with a sputtering technique, and then is connected with a drain electrode and the bottom electrode, through wiring formed in a contact hole.
(Preparation of Organic EL Light-Emitting Layer)

In the next step, the organic EL light-emitting layer is prepared by forming the following films with a heat resistance vapor deposition method: the film of 4,4'-bis[N,N-diamino]-4"-phenyl-triphenyl amine with the thickness of 60 nm as a hole injection layer; the film of 4,4'-bis[N-(1-naphthyl)-N-phenylamino]biphenyl with the thickness of 20 nm as a hole transport layer thereon; the film of 4,4'-bis(2,2-diphenyl)vinyl with the thickness of 40 nm as a light-emitting layer; and the film of tris(8-quinolinol) aluminum with the thickness of 20 nm as an electron transport layer.
(Preparation of Counter Electrode)

Finally, a counter electrode is prepared by forming the film of Al and Ag alloy into the thickness of 50 nm with a dual vapor deposition method, and the film of Al into the thickness of 50 nm.

When the above described element is driven by contacting a probe thereon, blue light is emitted from a back side of a substrate, in other words, a bottom emission type of the element is obtained.

In the present embodimentembodiment, it is important that the In—Ga—Zn—O-based amorphous-oxide semiconductor acquires desired electronic carrier concentration by controlling an amount of oxygen defect.

In the above description, an amount of oxygen (an amount of oxygen defect) in a transparent oxide film is controlled by forming the film in an atmosphere including a predetermined concentration of oxygen, but it is also preferable to control (reduce or increase) the amount of oxygen defect, by post-treating the oxide film formed in the previous step in the atmosphere including oxygen.

In order to effectively control an amount of oxygen defect, a temperature in an atmosphere including oxygen is controlled to 0° C. or higher and 300° C. or lower, preferably to 25° C. or higher and 250° C. or lower, and further preferably to 100° C. or higher and 200° C. or lower.

As a matter of course, the film may be formed in an atmosphere including oxygen and then be post-treated in the atmosphere including oxygen. In addition, the film may be formed in an atmosphere of which the oxygen partial pressure is not controlled, and be post-treated in the atmosphere including oxygen, if the method provides predetermined electronic carrier concentration (less than $1\times10^{18}/cm^3$).

Here, a lower limit of electronic carrier concentration in the present invention depends on what kind of an element, a circuit and a device an obtained oxide film is used for, but for instance, is $1\times10^{14}/cm^3$ or higher.

In the next place, with reference to FIG. 9, a second embodimentembodiment will be described in which a bottom electrode is directly connected with a drain electrode without interposing wiring between them.

Second Embodiment

Figure 9:
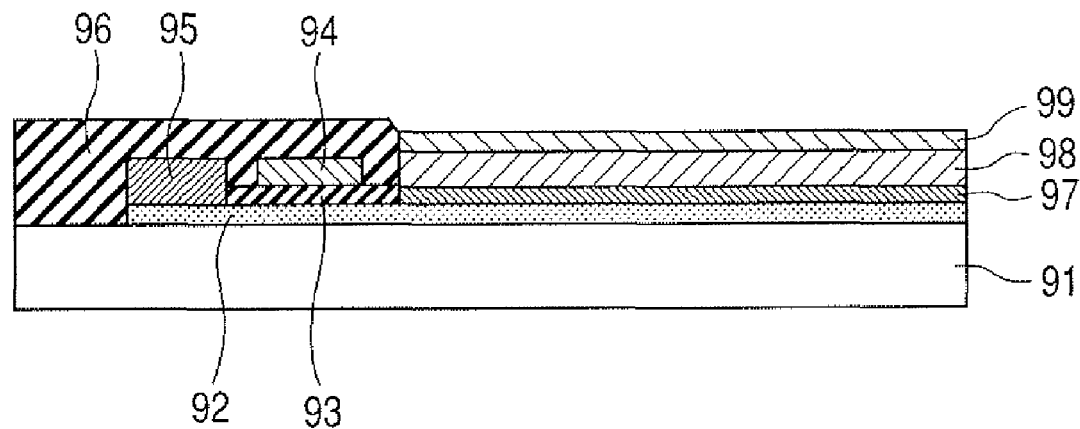
FIG. 9 is a diagrammatic drawing showing a cross section of a light-emitting device according to the present invention.

In FIG. 9, reference numeral 91 denotes a substrate, reference numeral 92 an active layer made of a semiconductor material peculiar to the present invention, reference numeral 93 a gate insulation film, reference numeral 94 a gate electrode, reference numeral 95 a source electrode, reference numeral 96 an insulation layer, and reference numeral 97 a bottom electrode. The bottom electrode 97 is layered on a drain electrode or is identical to the drain electrode, in other words, is the drain electrode in itself. Reference numeral 98 denotes an organic EL layer, and reference numeral 99 a counter electrode.

The present embodiment has basically the same type of configuration in the first embodiment in which a part of a bottom electrode contacts with a drain electrode through wiring, but has a different configuration in which the drain electrode and a light-emitting layer are layered on the same overlapping area when viewed from the position above a substrate 91, and the bottom electrode exists between them.

A drain electrode may be the same member as a bottom electrode. In this case, the drain electrode needs to have a capability of effectively injecting an electron or a hole into an organic EL layer.

It is preferable to control electronic carrier density in a part of an active layer corresponding to a bottom part of a drain electrode to $1\times10^{18}/cm^3$ or higher by increasing oxygen defects. Then, it can work as the drain electrode and a bottom electrode at the same time. In this case, it is preferable that the active layer is made of an In—Ga—Zn—O film, functions as a hole injection layer, and is connected with an anode part of a light-emitting layer.

FIG. 9 shows an example of a light-emitting layer arranged in an upper part of a TFT layer, but a configuration is acceptable in which a counter electrode of a first electrode and a bottom electrode of a second electrode are turned upside down, and the first electrode is directly layered on a drain electrode, if it does not cause a functional problem. In this case, the second electrode which has been the bottom electrode exists seemingly in the upper part, but it is functionally the same as long as it is connected with the drain electrode. Particularly, when an inorganic EL layer is employed, the inverse case can be adopted, because of having higher processing resistance than an organic EL layer has.

In a preferred configuration of a light-emitting device according to the present invention, first and second electrodes are a counter electrode and a bottom electrode, a field effect transistor is a TFT, an active layer of the TFT includes In, Ga and Zn, at least one part of the active layer is an amorphous oxide, and one part of a light-emitting layer is electrically connected with a drain electrode of the TFT.

In a light-emitting device according to the present invention, one part of a light-emitting layer is directly connected to a drain electrode, or one part of the light-emitting layer may be connected with the drain electrode through wiring. It is preferable that one part of thus connected light-emitting layer is an anode side or a cathode side of the light-emitting layer.

It is preferable that at least one of a drain electrode and the above described bottom electrode is a transparent electroconductive oxide.

In the next place, a third embodiment which is a configuration example of the application to a display will be described with reference to FIG. 8.

Although drain electrode 97 is utilized as the bottom electrode in FIG. 9, source electrode 95 may be utilized as the bottom electrode, depending on a constitution of layer structure of the light-emitting layer. That is, the present invention is characterized in connecting and so forth any one of the source electrode and the drain electrode of a transistor containing an amorphous oxide to an electrode sandwiching a light-emitting layer.

Third Embodiment

Figure 8:
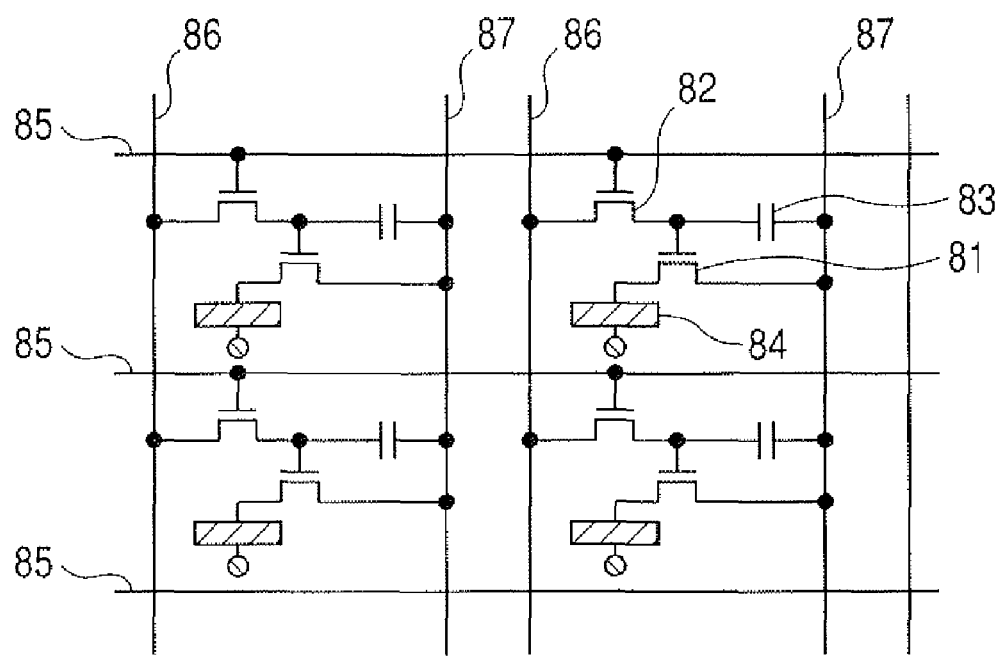
FIG. 8 is a circuit diagram when a light-emitting device according to the present invention is used for a display.

In FIG. 8, reference numeral 81 denotes a transistor for driving an organic EL layer 84, which passes a current to a light-emitting element that has the organic EL layer 84 and a pair of electrodes sandwiching the organic EL layer 84. Reference numeral 82 is a transistor 2 for selecting a picture element, which supplies a picture signal for determining a current to be passed to the light-emitting element, to a gate of the transistor 81.

In addition, a condenser 83 is placed in order to hold a selected condition, stores electrical charges between a common electrode wire 87 and a source electrode part of the transistor 2, and retains the signal of the gate of the transistor 1. The picture element is selected and determined by a scan electrode wire 85 and a signal electrode wire 86.

The configuration will be now more specifically described.

At the same time when a row selection signal is applied to a gate electrode from a driver circuit (not shown) through a scan electrode 85 in a form of a pulse signal, the picture signal is applied to a transistor 82 from another driver circuit (not shown) through a signal electrode 86 to select a picture element.

At this time, the transistor 82 is tuned ON and an electrical charge is stored in a condenser 83 placed between a signal electrode wire 86 and the source electrode of the transistor 82. Thereby, a gate voltage of the transistor 81 is held in a desired voltage corresponding to the picture signal, and the transistor 81 passes a current corresponding to the picture signal between the source electrode and a drain electrode. The state is retained till the transistors receive the next signal. While the transistor 81 passes the current, the current is continuously supplied to an organic EL layer 84 as well, and light emission is maintained.

The example of the FIG. 8 shows a configuration using two transistors and one condenser for one picture element, but the configuration may include more transistors in order to improve the performance.

It is essential that a light-emitting device can realize a normally off type of a TFT, by using a TFT having an active layer of an amorphous oxide illustrated by In—Ga—Zn—O-based oxide which is transparent and can be formed at a low temperature according to the present invention, in a transistor part, and consequently inhibits unnecessary light emission. The above TFT can also provide an electronograph and a display unit with high contrast.

Fourth Embodiment

Figure 11:
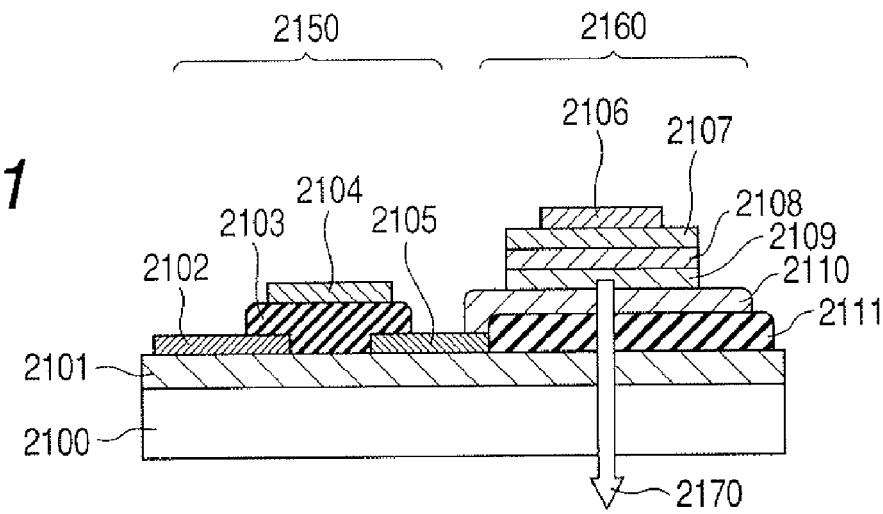
FIG. 11 is a sectional view describing a configuration example of a linearly arrayed light source according to the present invention.
Figure 12:
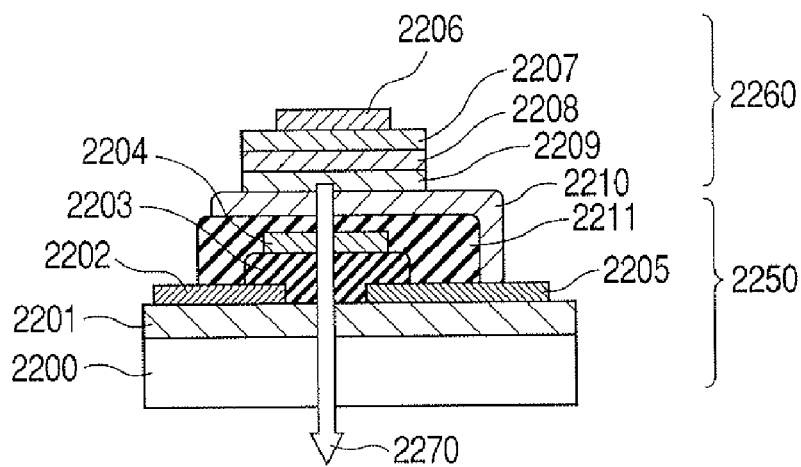
FIG. 12 is a sectional view (right above arrangement) describing a configuration example of a linearly arrayed light source according to the present invention.

A fourth embodiment according to the present invention is a bottom emission type of a light-emitting device as shown in FIGS. 11 and 12.

Specifically, the light-emitting device has the above described light-emitting layer and the above described field effect transistor arranged on an optically transparent substrate, and emits light from the above described light-emitting layer through the above described substrate. In FIG. 11, an active layer (a channel layer 2101) formed of an amorphous oxide arranged also right under a light-emitting element 2160, but needs not to be arranged right under it. As a matter of course, in a configuration of FIG. 11, light emitted from the light-emitting layer 2108 passes through the active layer formed of the above described amorphous oxide and the substrate 2100.

Figure 13:
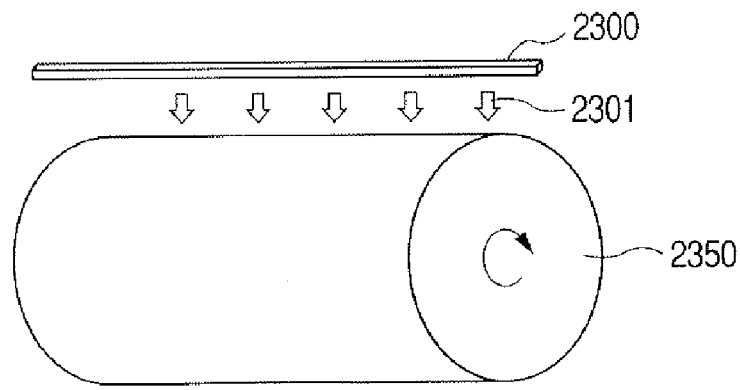
FIG. 13 is a diagrammatic drawing showing an arrangement example of a copying machine, a page printer, a photoconductor drum in an integral drum cartridge and a linearly arrayed light source.

By the way, a light source can be produced by disposing a light-emitting device according to the present invention in one dimension, and can make an apparatus by combining itself with a photoconductor drum 2350 of a photoreceptor as shown in FIG. 13. Specifically, an electronograph can be composed from the photoreceptor 2350, an electrifier (not shown) for electrifying the photoreceptor, an exposing light source 2300 for illuminating the photoreceptor to light 2301 in order to form a latent image on the photoreceptor and a developing unit (not shown) for developing the above described latent image.

An amorphous oxide described in the above described first and second embodiments will be described in detail below.
(Amorphous Oxide)

The active layer employed in the above Embodiments 1 to 3 of the invention is explained below.

The electron carrier concentration in the amorphous oxide in the present invention is a value measured at a room temperature. The room temperature is a temperature in the range from 0° C. to about 40° C., for example, 25° C. The electron carrier concentration in the amorphous oxide in the present invention need not be less than $10^{18}/cm^3$ throughout the entire range from 0 to 40° C. For example, the electron carrier concentration of less than $10^{18}/cm^3$ at a temperature of 25° C. is acceptable. At a lower electron carrier concentration, not more than $1\times10^{17}/cm^3$, or not more than $1\times10^{16}/cm^3$, a normally-off TFT can be produced at a high yield.

In the present specification, the description "less than $10^{18}/cm^3$" means "preferably less than $1\times10^{18}/cm^3$ and more preferably less than $1.0\times10^{18}/cm^3$". The electron carrier concentration can be measured by measurement of a Hall Effect.

The amorphous oxide in the present invention is an oxide which exhibits a halo pattern and no characteristic diffraction line in an X-ray diffraction spectrometry.

In the amorphous oxide of the present invention, the lower limit of the electron carrier concentration is, for example, $1\times10^{12}/cm^3$, but is not limited insofar as it is applicable as a channel layer of a TFT.

Accordingly, in the present invention, the electron carrier concentration is adjusted by controlling the material, composition ratio, production conditions, and so forth of the amorphous oxide as in the Examples described later to be in the range, for instance, from $1\times10^{12}/cm^3$ to $1\times10^{18}/cm^3$, preferably from $1\times10^{13}/cm^3$ to $1\times10^{17}/cm^3$, more preferably from $1\times10^{15}/cm^3$ to $1\times10^{16}/cm^3$.

The amorphous oxide, other than the InZnGa oxides, can be selected suitably from In oxides, $In_xZn_{1-x}$ oxides ($0.2 \leq x \leq 1$), $In_xSn_{1-x}$ oxides ($0.8 \leq x \leq 1$), and $In_x(Zn, Sn)_{1-x}$ oxides ($0.15 \leq x \leq 1$). The $In_x(Zn, Sn)_{1-x}$ oxide can also be represented by $In_x(Zn_ySn_{1-y})_{1-x}$ ($0 \leq y \leq 1$).

When the In oxide contains neither Zn nor Sn, the In can be partly substituted by Ga: $In_xGa_{1-x}$ oxide ($0 \leq x \leq 1$).

An amorphous oxide of an electron carrier concentration of $1\times10^{18}/cm^3$ which is prepared by the inventors of the present invention is described below in detail.

One group of the aforementioned oxides are characteristically constituted of In—Ga—Zn—O, represented by $InGaO_3(ZnO)_m$ (m: a natural number of less than 6) in a crystal state, and containing electron carriers at a concentration of less than $1\times10^{18}/cm^3$.

The other group of the aforementioned oxides are characteristically constituted of In—Ga—Zn—Mg—O, represented by $InGaO_3(Zn_{1-x}Mg_xO)_m$ (m: a natural number of less than 6, and $0 \leq x \leq 1$) in a crystal state, and containing electron carriers at a concentration of less than $1\times10^{18}/cm^3$.

The film constituted of such an oxide is preferably designed to exhibit preferably an electron mobility of higher than 1 $cm^2/V \cdot sec$.

By use of the above film as the channel layer, a TFT can be prepared which is normally-off with a gate current of less than 0.1 microampere in a transistor off-state, having an on-off ratio of higher than $1\times10^3$, being transparent to visible light and flexible.

In the above film, the electron mobility increases with the increase of the conduction electrons. The substrate for forming the transparent film includes glass plates, plastic plates, and plastic films.

In using the above amorphous oxide film as the channel layer, at least one of layers constituted of $Al_2O_3$, $Y_2O_3$ or $HfO_2$, or a mixed crystal compound thereof is useful as the gate insulator.

In a preferred embodiment, the film is formed in an oxygen gas-containing atmosphere without intentional addition of an impurity for increasing the electric resistance to the amorphous oxide.

The inventors of the present invention found that the amorphous thin films of semi-insulating oxides have characteristics that the electron mobility therein increases with increase in number of conduction electrons, and further found that a TFT prepared by use of the film is improved in transistor characteristics such as the on-off ratio, the saturation current in a pinch-off state, and the switching rate. Thus a normally-off type TFT can be produced by use of the amorphous oxide.

By use of the amorphous oxide thin film as the channel layer of a film transistor, the electron mobility can be made higher than 1 cm$^2$/V·sec, preferably higher than 5 cm$^2$/V·sec. The current between the drain terminal and the source terminal at an off-state (no gate voltage applied) can be controlled to be less than 10 microamperes, preferably less than more than 0.1 microamperes at the carrier concentration of lower than $1\times10^{18}$/cm$^3$, preferably lower than $1\times10^{16}$/cm$^3$. Further by use of this thin film, the saturation current after pinch-off can be raised to 10 microamperes or more and the on-off ratio can be raised to be higher than $1\times10^3$ for the electron mobility higher than 1 cm$^2$/V·sec, preferably higher than 5 cm$^2$/V·sec.

In a pinch-off state of the TFT, a high voltage is being applied to the gate terminal, and electrons are existing in a high density in the channel. Therefore, according to the present invention, the saturation current can be increased in correspondence with the increase of the electron mobility. Thereby, the transistor characteristics can be improved, such as increase of the on-off ratio, increase of the saturation current, and increase of the switching rate. In contrast, in a usual compound, the increase of electrons decreases the electron mobility owing to collision between electrons.

The structure of the aforementioned TFT may be a stagger (top gate) structure in which a gate insulator and a gate terminal are successively formed on a semiconductor channel layer, or a reversed stagger (bottom gate) structure in which a gate insulator and a semiconductor channel layer successively on a gate terminal.

(First Process for Film Formation: PLD Process)

The amorphous oxide thin film having the composition $InGaO_3(ZnO)_m$ (m: a natural number of less than 6) in a crystal state is stable up to a high temperature of 800° C. or higher when m is less than 6, whereas with increase of m, namely with increase of the ratio of ZnO to $InGaO_3$ near to the composition of ZnO, the oxide tends to crystallize. Therefore, the value m of the oxide is preferably less than 6 for use as the channel layer of the amorphous TFT.

The film formation is conducted preferably by a gas phase film formation process by use of a target of a polycrystalline sintered compact having a composition $InGaO_3(ZnO)_m$. Of the gas phase film formation processes, sputtering, and pulse laser vapor deposition are suitable. The sputtering is particularly suitable for the mass-production.

However, in formation of the amorphous film under usual conditions, oxygen defect can occur, so that the electron carrier concentration of less than $1\times10^{18}$/cm$^3$ and electric conductivity of less the 10 S/cm cannot be achieved. With such a film, a normally-off transistor cannot be constituted.

Figure 14:
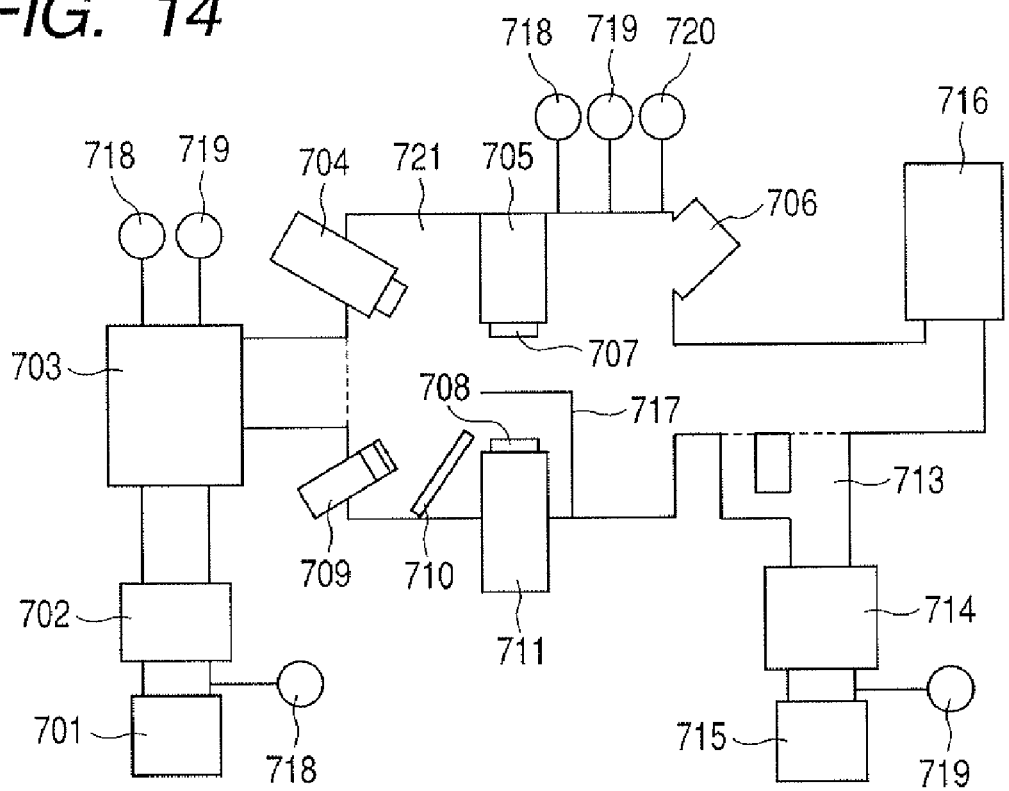
FIG. 14 is a schematic block diagram showing a pulsed laser vapor deposition apparatus.

The inventors of the present invention produced an In—Ga—Zn—O film by a pulse laser vapor deposition by use of the apparatus shown in FIG. 14.

The film-forming was carried out by using such a PLD film-forming apparatus as shown in FIG. 14.

In FIG. 14, the numerals indicate the followings: 701, an RP (rotary pump); 702, a TMP (turbo molecular pump); 703, a preliminary chamber; 704, an electron gun for RHEED; 705, a substrate-holding means for rotating and vertically moving the substrate; 706, a laser-introducing window; 707, a substrate; 708, a target; 709, a radical source; 710, a gas inlet; 711, a target-holding means for rotating and vertically moving the target; 712, a by-pass line; 713, a main line; 714, a TMP (turbo molecular pump); 715, an RP (rotary pump); 716, a titanium getter pump; 717, a shutter; 718, an IG (ion manometer); 719, a PG (Pirani gage); 720, a BG (baratron gage); and 721, a growth chamber.

An In—Ga—Zn—O type amorphous oxide semiconductor thin film was deposited on an $SiO_2$ glass substrate (Corning Co.: 1737) by a pulse laser vapor deposition employing a KrF excimer laser. As the pretreatment before the deposition, the substrate was washed ultrasonically for defatting with acetone, ethanol, and ultrapure water each for five minutes, and dried in the air at 100° C.

The polycrystalline target was an $InGaO_3(ZnO)_4$ sintered compact (size: 20 mm diameter, 5 mm thick), which had been prepared by wet-mixing $In_2O_3$, $Ga_2O_3$, and ZnO (each 4N reagent) as the source material (solvent: ethanol), calcining the mixture (1000° C., 2 hours), dry-crushing it, and sintering it (1550° C., 2 hours). The target had an electro conductivity of 90 S/cm.

The film formation was conducted by controlling the final vacuum of the growth chamber to be $2\times10^{-6}$ Pa, and the oxygen partial pressure during the growth to be 6.5 Pa. The oxygen partial pressure in growth chamber 721 was 6.5 Pa, and the substrate temperature was 25° C. The distance between target 708 and film-holding substrate 707 was 30 mm, the power introduced through introduction window 716 was in the range of 1.5-3 mJ/cm$^2$/pulse. The pulse width was 20 nsec, the repeating frequency was 10 Hz, and the irradiation spot size was 1×1 mm square. Under the above conditions, the film was formed at a rate of 7 nm/min.

The resulting thin film was examined by small angle X-ray scattering method (SAXS) (thin film method, incidence angle: 0.5°): no clear diffraction peak was observed. Thus the obtained In—Ga—Zn—O type thin film was judged to be amorphous. From X-ray reflectivity and its pattern analysis, the mean square roughness (Rrms) was found to be about 0.5 nm, and the film thickness to be about 120 nm. From fluorescence X-ray spectrometric analysis (XRF), the metal composition of the film was found to be In:Ga:Zn=0.98:1.02:4. The electric conductivity was less than about $1\times10^{-2}$ S/cm. The electron carrier concentration was estimated to be not more than $1\times10^{-16}$/cm$^3$. The electron mobility was estimated to be about 5 cm$^2$/V·sec. From light absorption spectrum analysis, the optical band gap energy breadth of the resulting amorphous thin film was estimated to be about 3 eV.

The above results show that the obtained In—Ga—Zn—O type thin film is a transparent flat thin film having an amorphous phase of a composition near to a crystalline $InGaO_3(ZnO)_4$, having less oxygen defect, and having lower electric conductivity.

The above film formation is explained specifically by reference to FIG. 1. FIG. 1 shows dependency of the electron carrier concentration in the formed transparent amorphous oxide thin film on the oxygen partial pressure for the film of a composition of $InGaO_3(ZnO)_m$ (m: an integer less than 6) in an assumed crystalline state under the same film formation conditions as in the above Example.

By formation of the film in an atmosphere having an oxygen partial pressure of higher than 4.5 Pa under the same conditions as in the above Example, the electron carrier concentration could be lowered to less than $1 \times 10^{18}/cm^3$ as shown in FIG. 1. In this film formation, the substrate was kept nearly at room temperature without intentional heating. For use of a flexible plastic film as the substrate, the substrate temperature is kept preferably at a temperature lower than 100° C.

The higher oxygen partial pressure enables decrease of the electron carrier concentration. For instance, as shown in FIG. 1, the thin $InGaO_3(ZnO)_4$ film formed at the substrate temperature of 25° C. and the oxygen partial pressure of 5 Pa had a lower electron carrier concentration of $1 \times 10^{16}/cm^3$.

Figure 2:
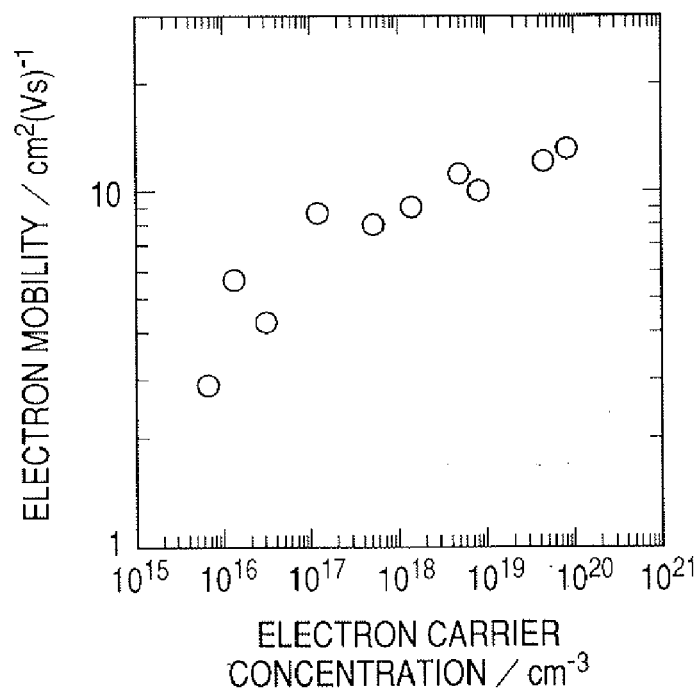
FIG. 2 is a diagrammatic drawing showing a relationship between electric conductivity in an In—Ga—Zn—O-based amorphous film formed with a sputtering method using an argon gas and a oxygen partial pressure while the film is being formed.

In the obtained thin film, the electron mobility was higher than 1 $cm^2/V \cdot sec$ as shown in FIG. 2. However, the film deposited by the pulse laser vapor deposition at an oxygen partial pressure of higher than 6.5 Pa as in this Example has a rough surface, being not suitable for a channel layer of the TFT.

Accordingly, a normally-off type transistor can be constructed by using a transparent thin amorphous oxide represented by $InGaO_3(ZnO)_m$ (m: a number less than 6) in a crystal state formed at an oxygen partial pressure of higher than 4.5 Pa, preferably higher than 5 Pa, but lower than 6.5 Pa by a pulse laser vapor deposition method in the above Example.

The above obtained thin film exhibited an electron mobility higher than 1 $cm^2/V$, and the on-off ratio could be made higher than $1 \times 10^3$.

As described above, in formation of an InGaZn oxide film by a PLD method under the conditions shown in this Example, the oxygen partial pressure is controlled in the range preferably from 4.5 Pa to 6.5 Pa.

For achieving the electron carrier concentration of $1 \times 10^{18}/cm^3$, the oxygen partial pressure conditions, the constitution of the film formation apparatus, the kind and composition of the film-forming material should be controlled.

Figure 5:
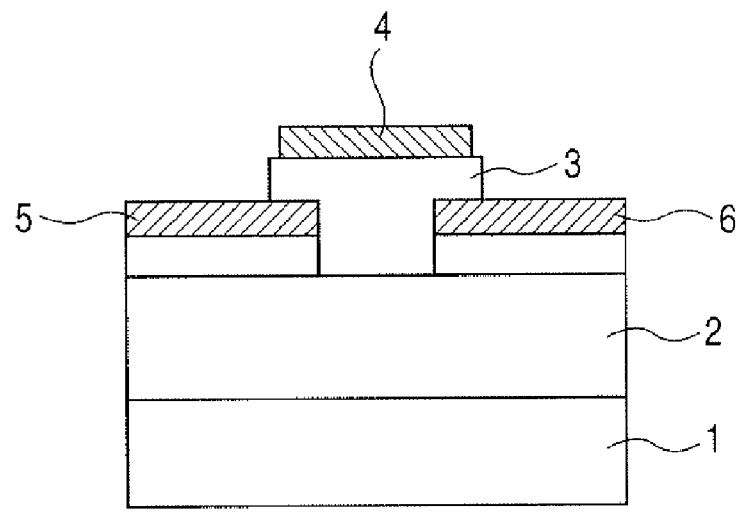
FIG. 5 is a schematic block diagram showing the structure of a top gate type MISFET element prepared in Embodiment 1.

Next, a top-gate type MISFET element as shown in FIG. 5 was produced by forming an amorphous oxide with the aforementioned apparatus at an oxygen partial pressure of 6.5 Pa. Specifically, on glass substrate 1, a semi-insulating amorphous $InGaO_3(ZnO)_4$ film of 120 nm thick was formed for use for channel layer 2 by the above method of formation of amorphous thin Ga—Ga—Zn—O film. Further thereon an $InGaO_3(ZnO)_4$ film having a higher electro conductivity and a gold film were laminated respectively in a thickness of 30 nm by pulse laser deposition at an oxygen partial pressure of lower than 1 Pa in the chamber. Then drain terminal 5 and source terminal 6 were formed by photolithography and a lift-off method. Finally, a $Y_2O_3$ film for gate insulator 3 was formed by an electron beam vapor deposition method (thickness: 90 nm, relative dielectric constant: about 15, leak current density: $1 \times 10^{-3}$ $A/cm^3$ at application of 0.5 MV/cm). Thereon, a gold film was formed, and gate terminal 4 was formed by photolithography and lifting-off.

Evaluation of Characteristics of MISFET Element

Figure 6:
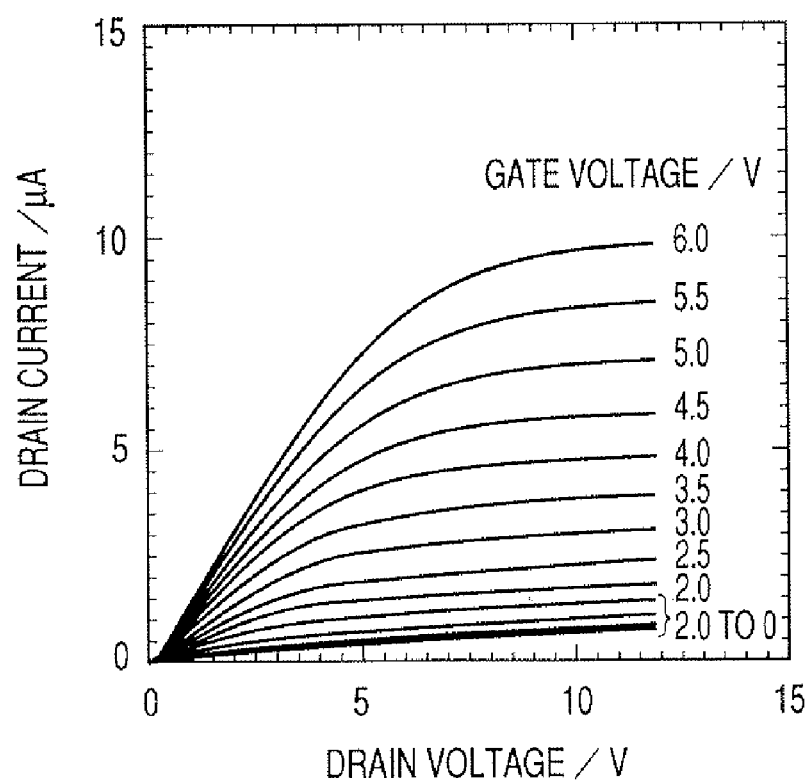
FIG. 6 is a diagrammatic drawing showing current-voltage characteristics of a top gate type MISFET element prepared in Embodiment 1.

FIG. 6 shows current-voltage characteristics of the MISFET element measured at room temperature. The channel is understood to be an n-type semiconductor from the increase of the drain current $I_{DS}$ with the increase of the drain voltage $V_{DS}$. This is consistent with the fact that an amorphous In—Ga—Zn—O type semiconductor is of an n-type. The $I_{DS}$ becomes saturated (pinched off) at $V_{DS}$=6V, which is typical behavior of a semiconductor transistor. From examination of the gain characteristics, the threshold value of the gate voltage $V_{GS}$ under application of $V_{DS}$=4V was found to be about −0.5 V. A current flow of $I_{DS}$=$1.0 \times 10^{-5}$ A was caused at $V_G$=10V. This corresponds to carrier induction by gate bias in the In—Ga—Zn—O type amorphous semiconductor thin film.

The on-off ratio of the transistor was higher than $1 \times 10^3$. From the output characteristics, the field effect mobility was calculated to be about 7 $cm^2(Vs)^{-1}$. Irradiation of visible light did not change the transistor characteristics of the produced element according to the same measurement.

According to the present invention, a thin film transistor can be produced which has a channel layer containing electron carriers at a lower concentration to achieve higher electric resistance and exhibiting a higher electron mobility.

The above amorphous oxide has excellent characteristics that the electron mobility increases with the increase of the electron carrier concentration, and exhibits degenerate conduction. In this Example, the thin film was formed on a glass substrate. However, a plastic plate or film is useful as the substrate since the film formation can be conducted at room temperature. Further, the amorphous oxide obtained in this Example, absorbs visible light only little to give transparent flexible TFT.

(Second Process for Film Formation: Sputtering Process (SP Process))

Film formation by a high-frequency SP process by use of an argon gas as the atmosphere gas is explained below.

Figure 15:
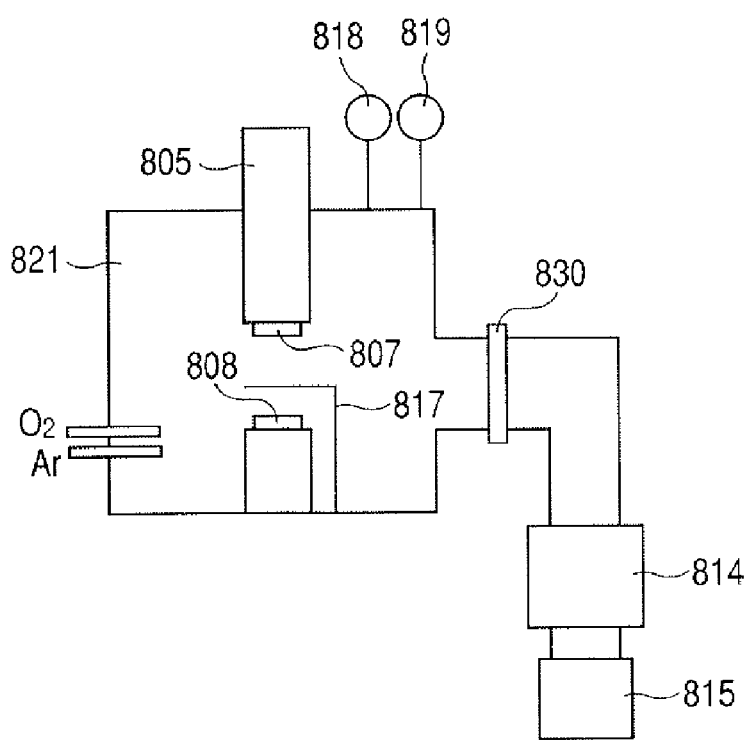
FIG. 15 is a schematic block diagram showing a sputtering film-forming apparatus.

The SP process was conducted by use of the apparatus shown in FIG. 15. In FIG. 15, the numerals indicates the followings: 807, a substrate for film formation; 808, a target; 805, a substrate-holding means equipped with a cooling mechanism; 814, a turbo molecular pump; 815, a rotary pump; 817, a shutter; 818, an ion manometer; 819, a Pirani gage; 821, a growth chamber; and 830, a gate valve.

Substrate 807 for film formation was an $SiO_2$ glass substrate (Corning Co.: 1737) which had been washed ultrasonically for defatting with acetone, ethanol, and ultrapure water respectively for 5 minutes, and dried at 100° C. in the air.

The target was a polycrystalline sintered compact having a composition of $InGaO_3(ZnO)_4$ (size: 20 nm diameter, 5 mm thick), which had been prepared by wet-mixing $In_2O_3$, $Ga_2O_3$, and ZnO (each 4N reagent) as the source material (solvent: ethanol), calcining the mixture (1000° C., 2 hours), dry-crushing it, and sintering (1550° C., 2 hours). Target 808 had an electro conductivity of 90 S/cm, being semi-insulating.

The final vacuum degree of growth chamber 821 was $1 \times 10^{-4}$ Torr. During the growth, the total pressure of the oxygen and argon gas was kept constant within the range of 4 to $0.1 \times 10^{-1}$ Pa. The partial pressure ratio of argon to oxygen was changed in the range of the oxygen partial pressure from $1 \times 10^{-3}$ to $2 \times 10^{-1}$ Pa.

The substrate temperature was room temperature. The distance between target 808 and substrate 807 for film formation was 30 mm.

The inputted electric power was RF 180 W, and the film forming rate was 10 nm/min.

The resulting thin film was examined by small angle X-ray scattering method (SAXS) (thin film method, incidence angle: 0.5°): no clear diffraction peak was observed. Thus the obtained In—Ga—Zn—O type thin film was judged to be amorphous. From X-ray reflectivity and its pattern analysis, the mean square roughness (Rrms) was found to be about 0.5 nm, and the film thickness to be about 120 nm. From fluorescence X-ray spectrometric analysis (XRF), the metal composition of the film was found to be In:Ga:Zn=0.98:1.02:4.

The films were formed at various oxygen partial pressure of the atmosphere, and the resulting amorphous oxide films were measured for electric conductivity. FIG. 3 shows the result.

As shown in FIG. 3, the electric conductivity can be lowered to less than 10 S/cm by conducting the film formation in an atmosphere having an oxygen partial pressure higher then $3\times10^{-2}$ Pa. The electron carrier number could be decreased by increase of the oxygen partial pressure.

As shown in FIG. 3, for instance, the thin $InGaO_3(ZnO)_4$ film formed at the substrate temperature of 25° C. and the oxygen partial pressure or $1\times10^{-1}$ Pa had a lower electric conductivity of about $1\times10^{-10}$ S/cm. Further, the thin $InGaO_3(ZnO)_4$ film formed at the oxygen partial pressure or $1\times10^{-1}$ Pa had an excessively high electric resistance, having the electric conductivity not measurable. With this film, although the electron mobility was not measurable, the electron mobility was estimated to be about 1 $cm^2/V \cdot sec$ by extrapolation from the values of the films of high electron carrier concentration.

Thus, a normally-off transistor having the on-off ratio of higher than $1\times10^3$ could be obtained by use of a transparent thin amorphous oxide film constituted of In—Ga—Zn—O represented in a crystal state by $InGaO_3(ZnO)_m$ (m: a natural number of less than 6) produced by sputtering vapor deposition in an argon atmosphere containing oxygen at a partial pressure of higher than $3\times10^{-2}$ Pa, preferably higher than $5\times10^{-1}$ Pa.

In use of the apparatus and the material employed in this Example, the film formation by sputtering is conducted in the oxygen partial pressure ranging from $3\times10^{-2}$ Pa to $5\times10^{-1}$ Pa. Incidentally, in the thin film produced by pulse laser vapor deposition or sputtering, the electron mobility increases with increase in number of the conductive electrons, as shown in FIG. 2.

As described above, by controlling the oxygen partial pressure, the oxygen defect can be decreased, and thereby the electron carrier concentration can be decreased. In the amorphous thin film, the electron mobility can be high, since no grain interface exists essentially in the amorphous state differently from polycrystalline state.

Incidentally, the substitution of the glass substrate by a 200 μm-thick polyethylene terephthalate (PET) film did not change the properties of the amorphous oxide film of $InGaO_3(ZnO)_4$ formed thereon.

A high-resistance amorphous film $InGaO_3(Zn_{1-x}Mg_xO)_m$ (m: an natural number less than 6; $0<x\leq1$) can be obtained by using, as the target, polycrystalline $InGaO_3(Zn_{1-x}Mg_xO)_m$ even at an oxygen partial pressure less than 1 Pa. For instance, with a target in which 80 atom % of Zn is replaced by Mg, the electron carrier concentration lower than $1\times10^{16}$/cm (resistance: about $1\times10^{-2}$ S/cm) can be achieved by pulse laser deposition in an atmosphere containing oxygen at a partial pressure of 0.8 Pa. In such a film, the electron mobility is lower than that of the Mg-free film, but the decrease is slight: the electron mobility is about 5 $cm^2/V \cdot sec$ at room temperature, being higher by about one digit than that of amorphous silicon. When the films are formed under the same conditions, increase of the Mg content decreases both the electric conductivity and the electron mobility. Therefore, the content of the Mg ranges preferably from 20% to 85% ($0.2<x<0.85$).

In the thin film transistor employing the above amorphous oxide film, the gate insulator contains preferably a mixed crystal compound containing two or more of $Al_2O_3$, $Y_2O_3$, $HfO_2$, and compounds thereof.

The presence of a defect at the interface between the gate-insulating thin film and the channel layer thin film lowers the electron mobility and causes hysteresis of the transistor characteristics. Moreover, the current leakage depends greatly on the kind of the gate insulator. Therefore the gate insulator should be selected to be suitable for the channel layer. The current leakage can be decreased by use of an $Al_2O_3$ film, the hysteresis can be made smaller by use of a $Y_2O_3$ film, and the electron mobility can be increased by use of an $HfO_2$ film having a high dielectric constant. By use of the mixed crystal of the above compounds, TFT can be formed which causes smaller current leakage, less hysteresis, and exhibiting a higher electron mobility. Since the gate insulator forming process and the channel layer forming process can be conducted at room temperature, the TFT can be formed in a stagger constitution or in a reversed stagger constitution.

The TFT thus formed is a three-terminal element having a gate terminal, a source terminal, and a drain terminal. This TFT is formed by forming a semiconductor thin film on a insulating substrate of a ceramics, glass, or plastics as a channel layer for transport of electrons or holes, and serves as an active element having a function of controlling the current flowing through the channel layer by application of a voltage to the gate terminal, and switching the current between the source terminal and the drain terminal.

In the present invention, it is important that an intended electron carrier concentration is achieved by controlling the amount of the oxygen defect.

In the above description, the amount of the oxygen in the amorphous oxide film is controlled by controlling the oxygen concentration in the film-forming atmosphere. Otherwise the oxygen defect quantity can be controlled (decreased or increase) by post-treatment of the oxide film in an oxygen-containing atmosphere as a preferred embodiment.

For effective control of the oxygen defect quantity, the temperature of the oxygen-containing atmosphere is controlled in the range from 0° C. to 300° C., preferably from 25° C. to 250° C., more preferably from 100° C. to 200° C.

Naturally, a film may be formed in an oxygen-containing atmosphere and further post-treated in an oxygen-containing atmosphere. Otherwise the film is formed without control of the oxygen partial pressure and post-treatment is conducted in an oxygen-containing atmosphere, insofar as the intended electron carrier concentration (less than $1\times10^{18}/cm^3$) can be achieved.

The lower limit of the electron carrier concentration in the present invention is, for example, $1\times10^{14}/cm^3$, depending on the kind of the element, circuit, or device employing the produced oxide film.

(Broader Range of Materials)

After investigation on other materials for the system, it was found that an amorphous oxide composed of at least one oxide of the elements of Zn, In, and Sn is useful for an amorphous oxide film of a low carrier concentration and high electron mobility. This amorphous oxide film was found to have a specific property that increase in number of conductive electrons therein increases the electron mobility. Using this film, a normally-off type TFT can be produced which is excellent in transistor properties such as the on-off ratio, the saturation current in the pinch-off state, and the switching rate.

In the present invention, an oxide having any one of the characteristics of (a) to (h) below are useful:

(a) An amorphous oxide which has an electron carrier concentration less than $1\times10^{18}/cm^3$;

(b) An amorphous oxide in which the electron mobility becomes increased with increase of the electron carrier concentration;

(The room temperature signifies a temperature in the range from about 0° C. to about 40° C. The term "amorphous compound" signifies a compound which shows a halo pattern only without showing a characteristic diffraction pattern in X-ray diffraction spectrum. The electron mobility signifies the one measured by the Hall effect.)

(c) An amorphous oxide mentioned in the above items (a) or (b), in which the electron mobility at room temperature is higher than 0.1 $cm^2/V \cdot sec$;

(d) An amorphous oxide mentioned, in any of the items (b) to (c), which shows degenerate conduction;

(The term "degenerate conduction" signifies the state in which the thermal activation energy in temperature dependency of the electric resistance is not higher than 30 meV.)

(e) An amorphous oxide, mentioned in any of the above item (a) to (d), which contains at least one of the elements of Zn, In, and Sn as the constituting element;

(f) An amorphous oxide film composed of the amorphous oxide mentioned the above item (e), and additionally at least one of the elements of Group-2 elements M2 having an atomic number lower than Zn (Mg, and Ca), Group-3 elements M3 having an atomic number lower than In (B, Al, Ga, and Y), Group-4 elements M4 having an atomic number lower than Sn (Si, Ge, and Zr), Group-5 elements M5 (V, Nb, and Ta), and Lu, and W to lower the electron carrier concentration;

(g) An amorphous oxide film, mentioned in any of the above items (a) to (f), constituted of a single compound having a composition of $In_{2-x}M3_xO_3(Zn_{1-y}M2_yO)_m$ ($0 \leq x \leq 1$; $0 \leq y \leq 1$; m: 0 or a natural number of less than 6) in a crystal state, or a mixture of the compounds different in number m, an example of M3 being Ga, and an example of M2 being Mg; and (h) An amorphous oxide film, mentioned in any of the above items (a) to (g) formed on a plastic substrate or an plastic film.

The present invention also provides a field-effect transistor employing the above mentioned amorphous oxide or amorphous oxide film as the channel layer.

A field-effect transistor is prepared which is employs an amorphous oxide film having an electron carrier concentration of less than $1 \times 10^{18}/cm^3$ but more than $1 \times 10^{15}/cm^3$ as the channel layer, and having a source terminal and a drain terminal, and a gate terminal with interposition of a gate insulator. When a voltage of about 5 V is applied between the source and drain terminals without application of gate voltage, the electric current between the source and drain terminals is about $1 \times 10^{-7}$ amperes.

The electron mobility in the oxide crystal becomes larger with increase of the overlap of the s-orbitals of the metal ions. In an oxide crystal of Zn, In, or Sn having a higher atomic number, the electron mobility is in the range from 0.1 to 200 $cm^2/V \cdot sec$.

In an oxide, oxygen and metal ions are bonded by ionic bonds without orientation of the chemical bonds, having a random structure. Therefore in the oxide in an amorphous state, the electron mobility can be comparable to that in a crystal state.

On the other hand, substitution of the Zn, In, or Sn with an element of a lower atomic number decreases the electron mobility. Thereby the electron mobility in the amorphous oxide of the present invention ranges from about 0.01 to 20 $cm^2/V \cdot sec$.

In the transistor having a channel layer constituted of the above oxide, the gate insulator is preferably formed from $Al_2O_3$, $Y_2O_3$, $HfO_2$, or a mixed crystal compound containing two or more thereof.

The presence of a defect at the interface between the gate-insulating thin film and the thin channel layer film lowers the electron mobility and causes hysteresis of the transistor characteristics. Moreover, the current leakage depends greatly on the kind of the gate insulator. Therefore the gate insulator should be selected to be suitable for the channel layer. The current leakage can be decreased by use of an $Al_2O_3$ film, the hysteresis can be made smaller by use of a $Y_2O_3$ film, and the electron mobility can be increased by use of an $HfO_2$ film having a high dielectric constant. By use of the mixed crystal of the above compounds, TFT can be formed which causes smaller current leakage, less hysteresis, and exhibiting a higher electron mobility. Since the gate insulator-forming process and the channel layer-forming process can be conducted at room temperature, the TFT can be formed in a stagger constitution or in a reversed stagger constitution.

The $In_2O_3$ oxide film can be formed through a gas-phase process, and addition of moisture in a partial pressure of about 0.1 Pa to the film-forming atmosphere makes the formed film amorphous.

ZnO and $SnO_2$ respectively cannot readily be formed in an amorphous film state. For formation of the ZnO film in an amorphous state, $In_2O_3$ is added in an amount of 20 atom %. For formation of the $SnO_2$ film in an amorphous state, $In_2O_3$ is added in an amount of 90 atom %. In formation of Sn—In—O type amorphous film, gaseous nitrogen is introduced in a partial pressure of about 0.1 Pa in the film formation atmosphere.

To the above amorphous film, may be added an element capable of forming a complex oxide, selected from Group-2 elements M2 having an atomic number lower than Zn (Mg, and Ca), Group-3 elements M3 having an atomic number lower than In (B, Al, Ga, and Y), Group-4 elements M4 having an atomic number lower than Sn (Si, Ge, and Zr), Group-5 elements M5 (V, Nb, and Ta), and Lu, and W. The addition of the above element stabilizes the amorphous film at room temperature, and broadens the composition range for amorphous film formation.

In particular, addition of B, Si, or Ge tending to form a covalent bond is effective for amorphous phase stabilization. Addition of a complex oxide constituted of ions having largely different ion radiuses is effective for amorphous phase stabilization. For instance, in an In—Zn—O system, for formation of a film stable at room temperature, In should be contained more than about 20 atom %. However, addition of Mg in an amount equivalent to In enables formation of stable amorphous film in the composition range of In of not less than about 15 atom %.

In a gas-phase film formation, an amorphous oxide film of the electron carrier concentration ranging from $1 \times 10^{15}/cm^3$ to $1 \times 10^{18}/cm^3$ can be obtained by controlling the film forming atmosphere.

An amorphous oxide film can be suitably formed by a vapor phase process such as a pulse laser vapor deposition process (PLD process), a sputtering process (SP process), and an electron-beam vapor deposition. Of the vapor phase processes, the PLD process is suitable in view of ease of material composition control, whereas the SP process is suitable in view of the mass production. However, the film-forming process is not limited thereto.

(Formation of In—Zn—Ga—O Type Amorphous Oxide Film by PLD Process)

An In—Zn—Ga—O type amorphous oxide was deposited on a glass substrate (Corning Co.: 1737) by a PLD process employing a KrF excimer laser with a polycrystal sintered compact as the target having a composition of $InGaO_3(ZnO)$ or $InGaO_3(ZnO)_4$.

The apparatus shown in FIG. 14 was employed which is mentioned before, and the film formation conditions were the same as mentioned before for the apparatus.

The substrate temperature was 25° C.

The resulting two thin films were examined by small angle X-ray scattering method (SAXS) (thin film method, incidence angle: 0.5°): no clear diffraction peak was observed, which shows that the obtained In—Ga—Zn—O type thin films produced with two different targets were both amorphous.

From X-ray reflectivity of the In—Zn—Ga—O type amorphous oxide film of the glass substrate and its pattern analysis, the mean square roughnesses (Rrms) of the thin films were found to be about 0.5 nm, and the film thicknesses to be about 120 nm. From fluorescence X-ray spectrometric analysis (XRF), the film obtained with the target of the polycrystalline sintered compact of $InGaO_3(ZnO)$ was found to contain the metals at a composition ratio In:Ga:Zn=1.1:1.1:0.9, whereas the film obtained with the target of the polycrystalline sintered compact of $InGaO_3(ZnO)_4$ was found to contain the metals at a composition ratio In:Ga:Zn=0.98:1.02:4.

Amorphous oxide films were formed at various oxygen partial pressure of the film-forming atmosphere with the target having the composition of $InGaO_3(ZnO)_4$. The formed amorphous oxide films were measured for the electron carrier concentration. FIG. 1 shows the results. By formation of the film in an atmosphere having an oxygen partial pressure of higher than 4.2 Pa, the electron carrier concentration could be lowered to less than $1 \times 10^{18}/cm^3$ as shown in FIG. 1. In this film formation, the substrate was kept nearly at room temperature without intentional heating. At the oxygen partial pressure of lower than 6.5 Pa, the surfaces of the obtained amorphous oxide films were flat.

At the oxygen partial pressure of 5 Pa, in the amorphous film formed with the $InGaO_3(ZnO)_4$ target, the electron carrier concentration was $1 \times 10^{16}/cm^3$, the electro conductivity was $1 \times 10^{-2}$ S/cm, and the electron mobility therein was estimated to be about 5 $cm^2/V \cdot sec$. From the analysis of the light absorption spectrum, the optical band gap energy breadth of the formed amorphous oxide film was estimated to be about 3 eV.

The higher oxygen partial pressure further lowered the electron carrier concentration. As shown in FIG. 1, in the In—Zn—Ga—O type amorphous oxide film formed at a substrate temperature of 25□ at an oxygen partial pressure of 6 Pa, the electron carrier concentration was lowered to $8 \times 10^{15}/cm^3$ (electroconductivity: about $8 \times 10^{-3}$ S/cm). The electron mobility in the film was estimated to be 1 $cm^2/V \cdot sec$ or more. However, by the PLD process, at the oxygen partial pressure of 6.5 Pa or higher, the deposited film has a rough surface, being not suitable for use as the channel layer of the TFT.

The In—Zn—Ga—O type amorphous oxide films were formed at various oxygen partial pressures in the film-forming atmosphere with the target constituted of a polycrystalline sintered compact having the composition of $InGaO_3(ZnO)_4$. The resulting films were examined for the relation between the electron carrier concentration and the electron mobility. FIG. 2 shows the results. Corresponding to the increase of the electron carrier concentration from $1 \times 10^{16}/cm^3$ to $1 \times 10^{20}/cm^3$, the electron mobility increased from about 3 $cm^2/V \cdot sec$ to about 11 $cm^2/V \cdot sec$. The same tendency was observed with the amorphous oxide films obtained with the polycrystalline sintered $InGaO_3(ZnO)$ target.

The In—Zn—Ga—O type amorphous oxide film which was formed on a 200 μm-thick polyethylene terephthalate (PET) film in place of the glass substrate had similar characteristics.

(Formation of In—Zn—Ga—Mg—O Type Amorphous Oxide Film by PLD Process)

A film of $InGaO_3(Zn_{1-x}Mg_xO)_4$ ($0<x\leq1$) was formed on a glass substrate by a PLD process with an $InGaO_3(Zn_{1-x}Mg_xO)_4$ target ($0<x\leq1$). The apparatus employed was the one shown in FIG. 14.

An $SiO_2$ glass substrate (Corning Co.: 1737) was used as the substrate. As the pretreatment, the substrate was washed ultrasonically for defatting with acetone, ethanol, and ultrapure water each for five minutes, and dried in the air at 100° C. The target was a sintered compact of $InGaO_3(Zn_{1-x}Mg_xO)_4$ (x=1-0) (size: 20 mm diameter, 5 mm thick).

The target was prepared by wet-mixing source materials $In_2O_3$, $Ga_2O_3$, and ZnO (each 4N reagent) (solvent: ethanol), calcining the mixture (1000° C., 2 hours), dry-crushing it, and sintering it (1550° C., 2 hours). The final pressure in the growth chamber was $2 \times 10^{-6}$ Pa. The oxygen partial pressure during the growth was controlled at 0.8 Pa. The substrate temperature was room temperature (25° C.). The distance between the target and the substrate for film formation was 30 mm. The KrF excimer laser was irradiated at a power of 1.5 $mJ/cm^2$/pulse with the pulse width of 20 nsec, the repeating frequency of 10 Hz, and the irradiation spot size of 1×1 mm square. The film-forming rate was 7 nm/min. The oxygen partial pressure in the film-forming atmosphere was 0.8 Pa. The substrate temperature was 25° C.

The resulting thin film was examined by small angle X-ray scattering method (SAXS) (thin film method, incidence angle: 0.5°): no clear diffraction peak was observed. Thus the obtained In—Ga—Zn—Mg—O type thin film was amorphous. The resulting film had a flat surface.

By using targets of different x-values (different Mg content), In—Zn—Ga—Mg—O type amorphous oxide films were formed at the oxygen partial pressure of 0.8 Pa in a film-forming atmosphere to investigate the dependency of the conductivity, the electron carrier concentration, and the electron mobility on the x-value.

Figure 4A:
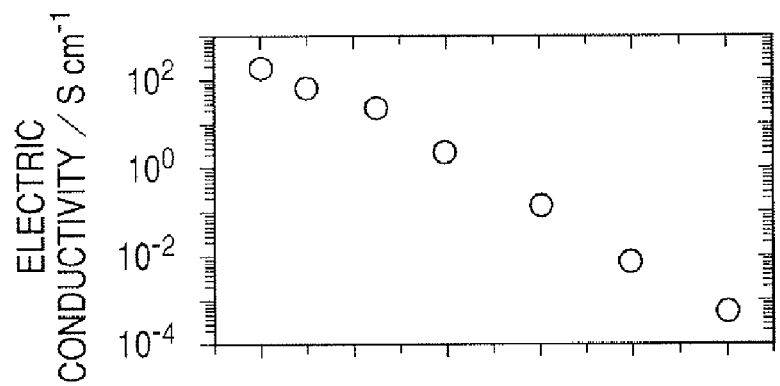
FIGS. 4A, 4B and 4C are diagrammatic drawings showing the changes of electric conductivity, carrier concentration and electron mobility with respect to a value of x of $InGaO_3(Zn_{1-x}Mg_xO)$ film-formed with a pulsed laser vapor deposition method in an atmosphere having an oxygen partial pressure of 0.8 Pa.
Figure 4B:
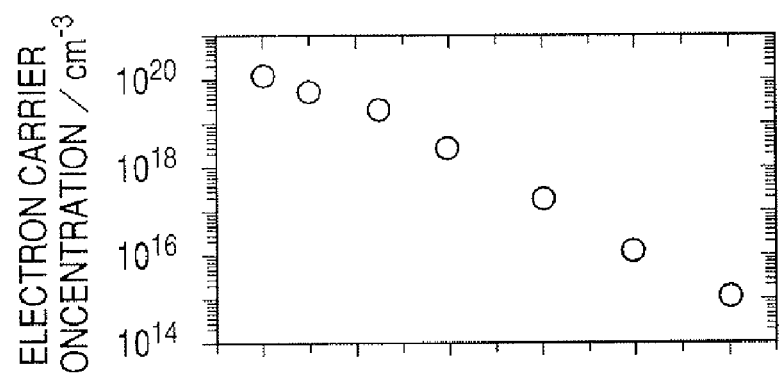
Figure 4C:
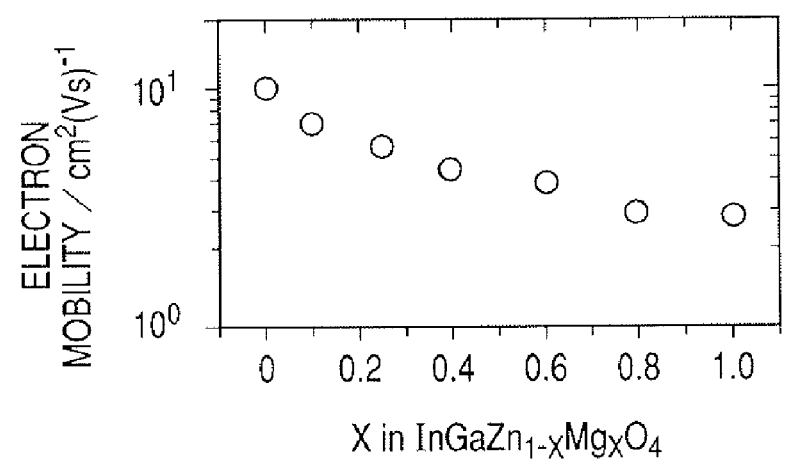

FIGS. 4A, 4B, and 4C show the results. At the x values higher than 0.4, in the amorphous oxide films formed by the PLD process at the oxygen partial pressure of 0.8 Pa in the atmosphere, the electron carrier concentration was decreased to be less than $1 \times 10^{18}/cm^3$. In the amorphous film of x value higher than 0.4, the electron mobility was higher than 1 $cm^2/V$.

As shown in FIGS. 4A, 4B, and 4C, the electron carrier concentration less than $1 \times 10^{16}/cm^3$ could be achieved in the film prepared by a pulse laser deposition process with the target in which 80 atom % of Zn is replaced by Mg and at the oxygen partial pressure of 0.8 Pa (electric resistance: about $1 \times 10^{-2}$ S·cm). In such a film, the electron mobility is decreased in comparison with the Mg-free film, but the decrease is slight. The electron mobility in the films is about 5 $cm^2/V \cdot sec$, which is higher by about one digit than that of amorphous silicon. Under the same film formation conditions, both the electric conductivity and the electron mobility in the film decrease with increase of the Mg content. Therefore, the Mg content in the film is preferably more than 20 atom % and less than 85 atom % ($0.2<x<0.85$), more preferably $0.5<x<0.85$.

The amorphous film of $InGaO_3(Zn_{1-x}Mg_xO)_4$ ($0<x\leq1$) formed on a 200 μm-thick polyethylene terephthalate (PET) film in place of the glass substrate had similar characteristics.
(Formation of $In_2O_3$ Amorphous Oxide Film by PLD Process)

An $In_2O_3$ film was formed on a 200 μm-thick PET film by use of a target constituted of $In_2O_3$ polycrystalline sintered compact by a PLD process employing a KrF excimer laser.

The apparatus used is shown in FIG. 14. The substrate for the film formation was an $SiO_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was an $In_2O_3$ sintered compact (size: 20 mm diameter, 5 mm thick), which had been prepared by calcining the source material $In_2O_3$ (4N reagent) (1000° C., 2 hours), dry-crushing it, and sintering it (1550° C., 2 hours).

The final vacuum of the growth chamber was $2\times10^{-6}$ Pa, the oxygen partial pressure during the growth was 5 Pa, and the substrate temperature was 25° C.

The water vapor partial pressure was 0.1 Pa, and oxygen radicals were generated by the oxygen radical-generating assembly by application of 200 W.

The distance between the target and the film-holding substrate was 40 mm, the power of the Krf excimer laser was 0.5 $mJ/cm^2$/pulse, the pulse width was 20 nsec, the repeating frequency was 10 Hz, and the irradiation spot size was 1×1 mm square.

The film-forming rate was of 3 nm/min.

The resulting thin film was examined by small angle X-ray scattering method (SAXS) (thin film method, incidence angle: 0.5°): no clear diffraction peak was observed, which shows that the obtained In—O type oxide film was amorphous. The film thickness was 80 nm.

In the obtained In—O type amorphous oxide film, the electron carrier concentration was $5\times10^{17}/cm^3$, and the electron mobility was about 7 $cm^2/V\cdot sec$.
(Formation of In—Sn—O Type Amorphous Oxide Film by PLD Process)

An In—Sn—O type oxide film was formed on a 200 μm-thick PET film by use of a target constituted of polycrystalline sintered compact of $(In_{0.9}Sn_{0.1})O_{3.1}$ by a PLD process employing a KrF excimer laser. The apparatus used is shown in FIG. 14.

The substrate for the film formation was an $SiO_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was an $In_2O_3$—$SnO_2$ sintered compact (size: 20 mm diameter, 5 mm thick), which had been prepared by wet-mixing the source materials $In_2O_3$—$SnO_2$ (4N reagents) (solvent: ethanol), calcining the mixture (1000° C., 2 hours), dry-crushing it, and sintering it (1550° C., 2 hours).

The substrate was kept at room temperature. The oxygen partial pressure was 5 Pa. The nitrogen partial pressure was 0.1 Pa. Oxygen radicals were generated by the oxygen radical-generating assembly by application of 200 W.

The distance between the target and the film-holding substrate was 30 mm, the power of the Krf excimer laser was 1.5 $mJ/cm^2$/pulse, the pulse width was 20 nsec, the repeating frequency was 10 Hz, and the irradiation spot size was 1×1 mm square.

The film-forming rate was of 6 nm/min.

The resulting thin film was examined by small angle X-ray scattering method (SAXS) (thin film method, incidence angle: 0.5°): no clear diffraction peak was detected, which shows that the obtained In—Sn—O type oxide film is amorphous.

In the obtained In—Sn—O type amorphous oxide film, the electron carrier concentration was $8\times10^{17}/cm^3$, and the electron mobility was about 5 $cm^2/V\cdot sec$. The film thickness was 100 nm.
(Formation of In—Ga—O Type Amorphous Oxide Film by PLD Process)

The substrate for the film was an $SiO_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was a sintered compact of $(In_2O_3)_{1-x}$—$(Ga_2O_3)_x$ (x=0-1) (size: 20 mm diameter, 5 mm thick). For instance, at x=0.1, the target is a polycrystalline sintered compact of $(In_{0.9}Ga_{0.1})_2O_3$.

This target was prepared by wet-mixing the source materials $In_2O_3$—$Ga_2O_2$ (4N reagents) (solvent: ethanol), calcining the mixture (1000° C., 2 hours), dry-crushing it, and sintering it (1550° C., 2 hours).

The final pressure of the growth chamber was $2\times10^{-6}$ Pa. The oxygen partial pressure during the growth was 1 Pa.

The substrate was at room temperature. The distance between the target and the film-holding substrate was 30 mm. The power of the Krf excimer laser was 1.5 $mJ/cm^2$/pulse. The pulse width was 20 nsec. The repeating frequency was 10 Hz. The irradiation spot size was 1×1 mm square. The film-forming rate was of 6 nm/min.

The substrate temperature was 25° C. The oxygen pressure was 1 Pa. The resulting film was examined by small angle X-ray scattering method (SAXS) (thin film method, incidence angle: 0.5°): no clear diffraction peak was detected, which shows that the obtained In—Ga—O type oxide film is amorphous. The film thickness was 120 nm.

In the obtained In—Ga—O type amorphous oxide film, the electron carrier concentration was $8\times10^{16}/cm^3$, and the electron mobility was about 1 $cm^2/V\cdot sec$.
(Preparation of TFT Element Having In—Zn—Ga—O type Amorphous Oxide Film (Glass Substrate))

A top gate type TFT element shown in FIG. 5 was prepared.

Firstly, an In—Ga—Zn—O type amorphous oxide film was prepared on glass substrate 1 by the aforementioned PLS apparatus with a target constituted of a polycrystalline sintered compact having a composition of $InGaO_3(ZnO)_4$ at an oxygen partial pressure of 5 Pa. The formed In—Ga—Zn—O film had a thickness of 120 nm, and was used as channel layer 2.

Further thereon, another In—Ga—Zn—O type amorphous film having a higher electro conductivity and a gold layer were laminated, each in 30 nm thick, by the PLD method at the oxygen partial pressure of lower than 1 Pa in the chamber. Therefrom drain terminal 5 and source terminal 6 were formed by photolithography and a lift-off method.

Finally, a $Y_2O_3$ film as gate insulator 3 was formed by electron beam vapor deposition (thickness: 90 nm, relative dielectric constant: about 15, leakage current density: $1\times10^{-3}$ $A/cm^2$ under application of 0.5 MV/cm). Further thereon, a gold film was formed and therefrom gate terminal 4 was formed by photolithography and a lift-off method. The channel length was 50 μm, and the channel width was 200 μm.

Evaluation of Characteristics of TFT Element

FIG. 6 shows current-voltage characteristics of the TFT element at room temperature. Drain current $I_{DS}$ increased with increase of drain voltage $V_{DS}$, which shows that the channel is of an n-type conduction.

This is consistent with the fact that an amorphous In—Ga—Zn—O type semiconductor is of an n-type. The $I_{DS}$ become saturated (pinched off) at $V_{DS}$=6V, which is typical behavior of a semiconductor transistor. From examination of the gain characteristics, the threshold value of the gate voltage $V_{GS}$ under application of $V_{DS}$=4V was found to be about −0.5 V. A current flow of $I_{DS}$=1.0×10$^{-5}$ A was cased at $V_G$=10V. This corresponds to carrier induction by a gate bias in the In—Ga—Zn—O type amorphous semiconductor thin film as the insulator.

The on-off ratio of the transistor was higher than 1×10$^3$. From the output characteristics, the field effect mobility was calculated to be about 7 cm$^2$(Vs)$^{-1}$ in the saturation region. Irradiation of visible light did not change the transistor characteristics of the produced element according to the same measurement.

The amorphous oxide of the electron carrier concentration lower than 1×10$^{18}$/cm$^3$ is useful as a channel layer of a TFT. The electron carrier concentration is more preferably less than 1×10$^{17}$/cm$^3$, still more preferably less than 1×10$^{16}$/cm$^3$.

(Preparation of TFT Element Having In—Zn—Ga—O type Amorphous Oxide Film (Amorphous Substrate))

A top gate type TFT element shown in FIG. 5 was prepared.

Firstly, an In—Ga—Zn—O type amorphous oxide film was prepared on polyethylene terephthalate (PET) film 1 by the aforementioned PLS apparatus with a target constituted of a polycrystalline sintered compact having a composition of InGaO$_3$(ZnO) at an oxygen partial pressure of 5 Pa in the atmosphere. The formed film had a thickness of 120 nm, and was used as channel layer 2.

Further thereon, another In—Ga—Zn—O type amorphous film having a higher electro conductivity and a gold layer were laminated, each in 30 nm thick, by the PLD method at the oxygen partial pressure of lower than 1 Pa in the chamber. Therefrom drain terminal 5 and source terminal 6 were formed by photolithography and a lift-off method.

Finally, gate insulator 3 was formed by an electron beam vapor deposition method. Further thereon, a gold film was formed and therefrom gate terminal 4 was formed by photolithography and a lift-off method. The channel length was 50 μm, and the channel width was 200 μm. Three TFTs of the above structure were prepared by using respectively one of the three kinds of gate insulators: Y$_2$O$_3$ (140 nm thick), Al$_2$O$_3$ (130 μm thick), and HfO$_2$ (140 μm thick).

Evaluation of Characteristics of TFT Element

The TFT elements formed on a PET film had current-voltage characteristics similar to that shown in FIG. 6 at room temperature. Drain current $I_{DS}$ increased with increase of drain voltage $V_{DS}$, which shows that the channel is of an n-type conduction. This is consistent with the fact that an amorphous In—Ga—Zn—O type semiconductor is of an n type. The $I_{DS}$ become saturated (pinched off) at $V_{DS}$=6V, which is typical behavior of a semiconductor transistor. A current flow of $I_{DS}$=1.0×10$^{-8}$ A was caused at $V_G$=0 V, and a current flow of $I_{DS}$=2.0×10$^{-5}$ A was caused at $V_G$=10V. This corresponds to carrier induction by gate bias in the insulator, the In—Ga—Zn—O type amorphous semiconductor oxide film.

The on-off ratio of the transistor was higher than 1×10$^3$. From the output characteristics, the field effect mobility was calculated to be about 7 cm$^2$(Vs)$^{-1}$ in the saturation region.

The elements formed on the PET film were curved at a curvature radius of 30 mm, and in this state, transistor characteristics were measured. However the no change was observed in the transistor characteristics. Irradiation of visible light did not change the transistor characteristics.

The TFT employing the Al$_2$O$_3$ film as the gate insulator has also transistor characteristics similar to that shown in FIG. 6. A current flow of $I_{DS}$=1.0×10$^{-8}$ A was caused at $V_G$=0 V, and a current flow of $I_{DS}$=5.0×10$^{-6}$ A was caused at $V_G$=10V. The on-off ratio of the transistor was higher than 1×10$^2$. From the output characteristics, the field effect mobility was calculated to be about 2 cm$^2$(Vs)$^{-1}$ in the saturation region.

The TFT employing the HfO$_2$ film as the gate insulator has also transistor characteristics similar to that shown in FIG. 6. A current flow of $I_{DS}$=1×10$^{-8}$ A was caused at $V_G$=0 V, and a current flow of $I_{DS}$=1.0×10$^{-6}$ A was caused at $V_G$=10 V. The on-off ratio of the transistor was higher than 1×10$^2$. From the output characteristics, the field effect mobility was calculated to be about 10 cm$^2$(Vs)$^{-1}$ in the saturation region.

(Preparation of TFT Element Employing In$_2$O$_3$ Amorphous Oxide Film by PLD Process)

A top gate type TFT element shown in FIG. 5 was prepared.

Firstly, an In$_2$O$_3$ type amorphous oxide film was formed on polyethylene terephthalate (PET) film 1 by the PLD method as channel layer 2 in a thickness of 80 nm.

Further thereon, another In$_2$O$_3$ amorphous film having a higher electro conductivity and a gold layer were laminated, each in 30 nm thick, by the PLD method at the oxygen partial pressure of lower than 1 Pa in the chamber, and at the voltage application of zero volt to the oxygen radical generating assembly. Therefrom drain terminal 5 and source terminal 6 were formed by photolithography and a lift-off method.

Finally, a Y$_2$O$_3$ film as gate insulator 3 was formed by an electron beam vapor deposition method. Further thereon, a gold film was formed and therefrom gate terminal 4 was formed by photolithography and a lift-off method.

Evaluation of Characteristics of TFT Element

The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—O type amorphous oxide film is an n type conductor. The $I_{DS}$ become saturated (pinched off) at about $V_{DS}$=6V, which is typical behavior of a transistor. A current flow of $I_{DS}$=2×10$^{-8}$ A was caused at $V_G$=0 V, and a current flow of $I_{DS}$=2.0×10$^{-6}$ A was caused at $V_G$=10 V. This corresponds to electron carrier induction by gate bias in the insulator, the In—O type amorphous oxide film.

The on-off ratio of the transistor was about 1×10$^2$. From the output characteristics, the field effect mobility was calculated to be about 1×10 cm$^2$ (Vs)$^{-1}$ in the saturation region. The TFT element formed on a glass substrate had similar characteristics.

The elements formed on the PET film were curved in a curvature radius of 30 mm, and in this state, transistor characteristics were measured. No change was observed in the transistor characteristics.

(Preparation of TFT Element Employing In—Sn—O type Amorphous Oxide Film by PLD Process)

A top gate type TFT element shown in FIG. 5 was prepared.

Firstly, an In—Sn—O type amorphous oxide film was formed in a thickness of 100 nm as channel layer 2 on polyethylene terephthalate (PET) film 1 by the PLD method.

Further thereon, another In—Sn—O amorphous film having a higher electro conductivity and a gold layer were laminated, each in 30 nm thick, by the PLD method at the oxygen partial pressure lower than 1 Pa in the chamber, and at voltage application of zero volt to the oxygen radical generating assembly. Therefrom drain terminal 5 and source terminal 6 were formed by photolithography and a lift-off method.

Finally, a $Y_2O_3$ film as gate insulator 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—Sn—O type amorphous oxide film is an n type conductor. The $I_{DS}$ became saturated (pinched off) at about $V_{DS}$=6V, which is typical behavior of a transistor. A current flow of $I_{DS}$=5×10$^{-8}$ A was caused at $V_G$=0 V, and a current flow of $I_{DS}$=5.0×10$^{-5}$ A was caused at $V_G$=10 V. This corresponds to electron carrier induction by the gate bias in the insulator, the In—Sn—O type amorphous oxide film.

The on-off ratio of the transistor was about 1×10$^3$. From the output characteristics, the field effect mobility was calculated to be about 5 cm$^2$ (Vs)$^{-1}$ in the saturation range. The TFT element formed on a glass substrate had similar characteristics.

The elements formed on the PET film were curved at a curvature radius of 30 mm, and in this state, transistor characteristics were measured. No change was caused thereby in the transistor characteristics.
(Preparation of TFT Element Employing In—Ga—O type Amorphous Oxide Film by PLD Process)

A top gate type TFT element shown in FIG. 5 was prepared.

Firstly, an In—Ga—O type amorphous oxide film was formed in a thickness of 120 nm as channel layer 2 on polyethylene terephthalate (PET) film 1 by the PLD method shown in Example 6.

Further thereon, another In—Ga—O amorphous film having a higher conductivity and a gold layer were laminated, each in 30 nm thick, by the PLD method at the oxygen partial pressure of lower than 1 Pa in the chamber, and at the voltage application of zero volt to the oxygen radical-generating assembly. Therefrom drain terminal 5 and source terminal 6 were formed by photolithography and a lift-off method.

Finally, a $Y_2O_3$ film as gate insulator 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—Ga—O type amorphous oxide film is an n type conductor. The $I_{DS}$ became saturated (pinched off) at about $V_{DS}$=6V, which is typical behavior of a transistor. A current flow of $I_{DS}$=1×10$^{-8}$ A was caused at $V_G$=0 V, and a current flow of $I_{DS}$=1.0×10$^{-6}$ A was caused at $V_G$=10 V. This corresponds to electron carrier induction by the gate bias in the insulator, the In—Ga—O type amorphous oxide film.

The on-off ratio of the transistor was about 1×10$^2$. From the output characteristics, the field effect mobility was calculated to be about 0.8 cm$^2$ (Vs)$^{-1}$ in the saturation range. The TFT element formed on a glass substrate had similar characteristics.

The elements formed on the PET film were curved at a curvature radius of 30 mm, and in this state, transistor characteristics were measured. No change was caused thereby in the transistor characteristics.

The amorphous oxide of the electron carrier concentration of lower than 1×10$^{18}$/cm$^3$ is useful as the channel layer of the TFT. The electron carrier concentration is more preferably not higher than 1×10$^{17}$/cm$^3$, still more preferably not higher than 1×10$^{16}$/cm$^3$.

An embodiment on a light-emitting device according to the present invention will be now shown below.

Example 1

An example of a light-emitting device will be described in detail with reference to an embodiment.

An amorphous In—Ga—Zn—O thin film was formed on a substrate so as to acquire a composition of In:Ga:Zn=0.98: 1.02:4, by using the already described PLD method.

A top gate type MISFET element shown in FIG. 5 was prepared by the steps of:

at first, forming a semi-insulating amorphous InGaO$_3$(ZnO)$_4$ film into a thickness of 120 nm on the glass substrate (1), which is used as a channel layer (2), with the method of having prepared the above described amorphous In—Ga—Zn—O thin film; layering an InGaO$_3$(ZnO)$_4$ film with high electroconductivity and a gold film respectively into the thickness of 30 nm further thereon with a pulsed laser deposition method in a chamber with an oxygen partial pressure of less than 1 Pa, and forming a drain terminal (5) and a source terminal (6) with a photolithographic method and a lift-off technology; and finally, forming a $Y_2O_3$ film which is used as a gate insulation film (3) with an electron beam vacuum deposition method (thickness: 90 nm, relative permittivity: about 15, and leak current density: 1×10$^{-3}$ A/cm$^2$ when 0.5 MV/cm is applied), forming a gold film thereon, and forming a gate terminal (4) with the photolithographic method and the lift-off technology.
(Evaluation for Characteristics of MISFET Element)

FIG. 6 shows current/voltage characteristics of an MISFET element measured at room temperature. When drain voltage $V_{DS}$ increases, a drain current $I_{DS}$ also increases, which shows that a channel is an n-type semiconductor. The result is not contradictory to a fact that an amorphous In—Ga—Zn—O-based semiconductor is an n-type. The MISFET element showed the typical behavior of a semiconductor transistor in which an $I_{DS}$ saturates (pinches off) at a $V_{DS}$ of about 6 V. As a result of having examined a gain characteristic, the threshold value of gate voltage $V_{GS}$ showed about −0.5 V when a $V_{DS}$ of 4 V was applied. In addition, a current $I_{DS}$ showed 1.0×10$^{-5}$ amperes when a $V_G$ of 10 V was applied. The result means that an In—Ga—Zn—O base amorphous semiconductor thin film of an insulation material induced a carrier therein by a gate bias.

An ON/OFF ratio of a transistor exceeded 1×10$^3$. In addition, as a result of calculating electron field-effect mobility from output characteristics, the electron field-effect mobility was about 7 cm$^2$ (Vs)$^{-1}$ in a saturation range. Similar measurement was performed on the prepared element while irradiating it with visible light, the element did not show any change of transistor characteristics. Herefrom, it is understood that the prepared element can be used as an opening also in a bottom emission type, without needing to interrupt a transistor region from light.

An MISFET element was formed with the approximately same method as the above described method. But after the MISFET element was prepared, an insulation film was formed into the thickness of 300 nm thereon with a pulsed laser deposition method. At the same time, a contact hole for connecting a drain or source terminal with a bottom electrode was formed.

Subsequently, the film of Al was formed into the thickness of 300 nm with a resistance heating vacuum deposition method, and the film of an alloy of Al and Ag was formed into the thickness of 50 nm thereon for a bottom electrode. The bottom electrode was connected with a drain or source electrode through a contact hole.

Subsequently, an organic EL light-emitting layer was prepared by forming the following films with a resistance vapor deposition method: the film of tris(8-quinolinol) aluminum with the thickness of 20 nm as an electron transport layer; the film of 4,4'-bis(2,2-diphenyl)vinyl with the thickness of 40 nm as a light-emitting layer thereon; the film of 4,4'-bis[1-(naphthyl)-N-phenylamino]biphenyl with the thickness of 20 nm as a hole transport layer; and the film of 4,4'-bis[N,N-diamino]-4"-phenyl-triphenyl amine] with the thickness of 60 nm as a hole injection layer.

Finally, the film of ITO was formed into the thickness of 200 nm for a counter electrode with a counter target sputtering technique.

When the above described element was driven by contacting a probe thereon, blue light was emitted from a top surface of a substrate, in other words, a top emission type of the element was obtained.

Example 2

Bottom Emission Type

Subsequently, an example of a preparation process for a light-emitting device of a bottom emission type, in which a drain electrode and a bottom electrode are directly connected, will be described with reference to FIG. 9.

An MISFET element was formed with the approximately same method as in the above described Embodiment 1. But a drain electrode was not formed, and an active layer 92 was left to have the same area as that of a light-emitting layer. Subsequently, the film of InGaO$_3$(ZnO)$_4$ with high electroconductivity was formed into the thickness of 200 nm thereon, as an electrode 97 serving as the drain (or source) electrode and a bottom electrode, with a pulsed laser deposition method in a chamber having an oxygen partial pressure of less than 1 Pa.

Then, an organic EL light-emitting layer was formed by forming an organic layer in a retrograde order of Embodiment 1 with a resistance evaporation method, and the whole integrated layers were named as the organic EL light-emitting layer.

Finally, the film of Al doped with Li was formed into the thickness of 50 nm, and the film of Al into the thickness of 200 nm as a counter electrode 99, with a resistance heating method.

When the above described element is driven by contacting a probe thereon, blue light was emitted from a back side of a substrate, in other words, a bottom emission type of the element is obtained.

Example 3

Linearly Arrayed Light Source

A linearly arrayed light source according to the present invention will be described with reference to FIG. 10.

Figure 10:
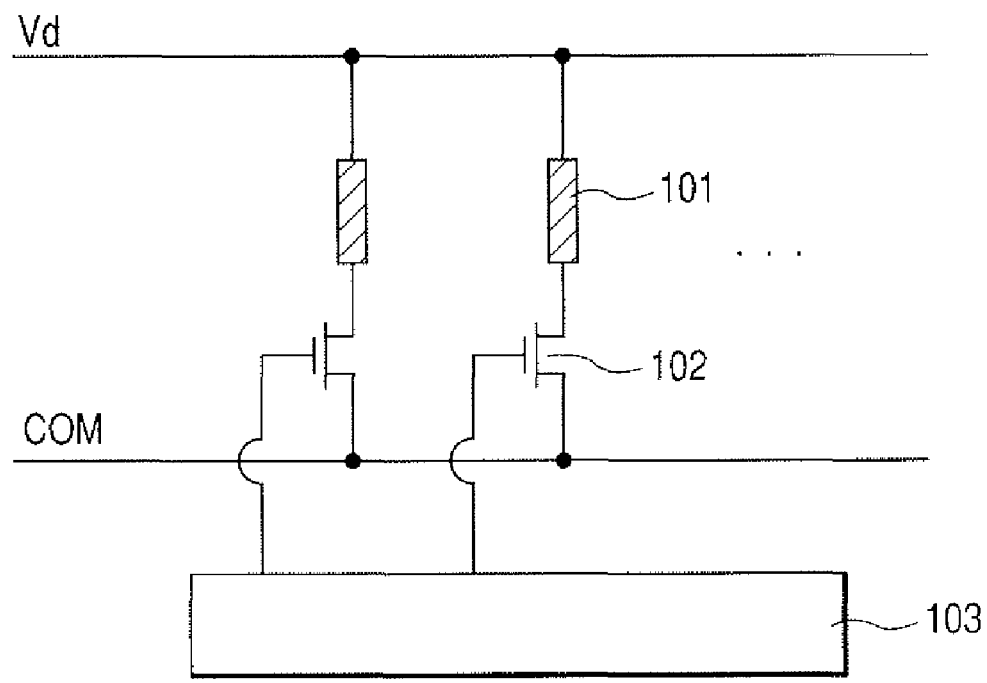
FIG. 10 is a diagrammatic drawing describing the electrical connection of a linearly arrayed light source according to the present invention.

A plurality of light-emitting elements 101 and thin film transistors (TFT) 102 were arranged on a substrate into a linear form, and were electrically connected as shown in FIG. 10. A linearly arrayed light source was prepared by connecting a control circuit 103 for controlling light-emitting with the light-emitting elements and the TFTs. A TFT output (a source electrode or a drain electrode) was connected with a power source Vd through the light-emitting element, and the other was connected with a common electric potential COM. In addition, the control circuit was connected to the gate electrode of the TFT.

When a TFT was turned on by a signal output from a control circuit, a light-emitting element emitted light. Specifically, the linearly arrayed light source could emit a desired linear light-emitting pattern when a signal from the control circuit was appropriately controlled.

Here, the light-emitting element can employ an arbitrary light-emitting element such as an organic electroluminescent element (an organic EL), an inorganic electroluminescent element (an inorganic EL) and a LED. In addition, a circuit configuration is not limited thereto, but a plurality of TFTs may be arranged with respect to one light-emitting element.

Thus, a configuration of driving a light-emitting element by an amorphous-oxide TFT can be extremely easily manufactured, and inexpensively provide a linearly arrayed light source.

FIG. 11 shows a sectional view of an example having a configuration of a linearly arrayed light source according to the present invention.

As shown in FIG. 11, a linearly arrayed light source is prepared by arranging a TFT part and a light-emitting element section on a substrate, and each element on each portion. FIG. 11 shows a case of using an organic EL element as a light-emitting element, and the above described amorphous oxide TFT in a TFT portion.

In the figure, reference numeral 2100 denotes a substrate, reference numeral 2101 a channel layer, reference numeral 2102 a source electrode, reference numeral 2103 a gate insulation film, reference numeral 2104 a gate electrode, reference numeral 2105 a drain electrode, reference numeral 2106 an upper electrode (first electrode), reference numeral 2107 an electron transport layer, reference numeral 2108 a light-emitting layer, reference numeral 2109 a hole transport layer, reference numeral 2110 a transparent electrode layer, reference numeral 2111 an insulation layer, reference numeral 2150 a TFT section and reference numeral 2160 a light-emitting element section.

FIG. 11 shows an example of connecting drain electrode 2105 to transparent electrode layer 2110 of the light-emitting element section. However, there is also a case of connecting source electrode 2102 to transparent electrode layer 2110, depending on a layer constitution of the light-emitting layer.

As for a preparation method, the linearly arrayed light source was prepared by the steps of forming an amorphous oxide TFT on a predetermined position on a substrate with the above described technique, then an organic EL element, and further wiring each on other positions.

At this time, when having formed a gate oxide film of an amorphous oxide TFT, the same insulation layer was formed at a portion in which an organic EL element would be arranged. The organic EL element was prepared by placing a mask on a substrate, and sequentially forming a transparent electrode layer, subsequently, a hole transport layer, a light-emitting layer, an electron transport layer and an upper electrode layer. During the above steps, the transparent electrode layer was connected to a drain electrode layer. Finally, various wiring was formed by an aluminum film or the like.

Here, an arbitrary transparent electroconductive film such as In$_2$O$_3$:Sn can be used as a transparent electrode layer. A material which is used in a general organic EL element can be applied to a hole transport layer, a light-emitting layer, an electron transport layer and an upper electrode layer. For instance, α-NPD can be used as the hole transport layer, CBP doped with 6% Ir (ppy)$_3$ as the light-emitting layer, Alq3 as the electron transport layer and AgMg as the upper electrode layer.

In the above description,

Alq3 means an aluminum-quinolinol complex;

α-NPD; and

Ir (ppy)$_3$ means an iridium-phenyl pyridine complex.

In the above configuration, light emitted from a light-emitting element passed through a transparent electrode and was emitted from a substrate side, as is shown by an arrow 2170 in the figure.

Thus obtained linearly arrayed light source was small, lightweight and inexpensive.

As for another configuration of a linearly arrayed light source, there can be the configuration of arranging an organic EL element on an upper part of a TFT placed on a substrate as shown in FIG. 12. The above linearly arrayed light source can make light emitted from a light-emitting element pass through a TFT section and emanate from a substrate side, by making an amorphous oxide TFT a transparent device through preparing an electrode with a transparent electrode such as In$_2$O$_3$:Sn.

In FIG. 12, reference numeral 2200 denotes a substrate, reference numeral 2201 a channel layer, reference numeral 2202 a source electrode, reference numeral 2203 a gate insulation film, reference numeral 2204 a gate electrode, reference numeral 2205 a drain electrode, reference numeral 2206 an upper electrode (a first electrode), reference numeral 2207 an electron transport layer, reference numeral 2208 a light-emitting layer, reference numeral 2209 a hole transport layer, reference numeral 2210 a transparent electrode layer, reference numeral 2211 an insulation layer, reference numeral 2250 a TFT section and reference numeral 2260 a light-emitting element section.

FIG. 12 shows an example of connecting drain electrode 2205 to transparent electrode layer 2210 of the light-emitting element section. However, there is also a case of connecting source electrode 2202 to transparent electrode layer 2210, depending on a layer constitution of the light-emitting layer.

Thus formed configuration makes light emanate in the way as indicated by an arrow 2270, enables a substrate surface to be effectively used, and can make a linearly arrayed light source arrange organic EL elements thereon at high density, and/or acquire a large light-emitting area (an open area ratio). Thus obtained linearly arrayed light source is small, lightweight and inexpensive.

Example 4

Application to Copying Machine and Page Printer

In the next place, a linearly arrayed light source applied to a copying machine or a page printer will be described.

Most of general copying machines or page printers have a system for printing data on a draughting medium, of scanning a laser beam over a photoconductor drum by using a lens and a polygon mirror to print the data thereon, and recording the data on the photoconductor drum.

On the other hand, the above devices can be small and inexpensive if employing a linearly arrayed light source according to the present invention, because of directly irradiating a photoconductor drum with light emitted from a light-emitting element without passing the light through a lens system, as shown in FIG. 13. As a result, the above devices need no large-scaled optical system, and accordingly can be miniaturized and reduce the manufacturing cost. If necessary, the above devices may arrange a simple optical system such as SELFOC lens between the light-emitting element and the drum.

In FIG. 13, reference numeral 2300 denotes a linearly arrayed light source, and reference numeral 2350 a photoconductor drum.

When preparing the above copying machine or a page printer, it is preferable to unify the above linearly arrayed light source with a photoconductor drum cartridge.

The linearly arrayed light source is inexpensive and accordingly disposable, and as a result, can make the copying machine or the page printer maintenance-free through preparing a single-piece structure combined with the photoconductor drum, while making use of the above characteristics. The above described light source may be arranged outside the photoconductor (a photoconductor drum) as shown in the present embodiment or may also be arranged in the inside.

When an electronograph employs the linearly arrayed light source according to the present embodiment, the electronograph forms an image by using an electrifier for electrifying the photoreceptor (a photoconductor drum), an exposing light source for illuminating the photoreceptor in order to form a latent image on the photoreceptor, and a developing device for developing the above described latent image; and employs the linearly arrayed light source according to the present invention for the exposing light source.

INDUSTRIAL APPLICABILITY

A light-emitting device according to the present invention forms a thin film of a semiconductor on a flexible material including a plastics film, and can be applied to a wide area of uses including a flexible display unit, an IC card and an ID tag.

The light-emitting device can also be applied to a linearly arrayed light source, a copying machine, a page printer and an integrated drum cartridge.

This application claims priority from Japanese Patent Application No. 2004-326684 filed Nov. 10, 2004, which is hereby incorporated by reference herein.

What is claimed is:

1. A light-emitting device having a light-emitting element comprising first and second electrodes and a light-emitting layer existing between the first and second electrodes, and a field effect transistor for driving the light-emitting element, wherein an active layer of the field effect transistor comprises an amorphous oxide of a compound having
   (a) a composition when in crystalline state represented by In$_{2-x}$M3$_x$O$_3$(Zn$_{1-y}$M2$_y$O)$_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
   (b) an electron carrier concentration of greater than 10$^{12}$/cm$^3$ and lesser than 10$^{18}$/cm$^3$ wherein a current between a drain terminal and a source terminal of the field effect transistor when no gate voltage is applied is less than 10 microamperes; and
   (c) oxygen defect density decreased by treatment in an atmosphere including oxygen at a predetermined pressure during or after formation of the active layer of the amorphous oxide.

2. The light-emitting device according to claim 1, wherein the amorphous oxide includes at least one of In, Zn and Sn.

3. The light-emitting device according to claim 1, wherein the amorphous oxide is any one selected from the group consisting of an oxide containing In, Zn, and Sn; an oxide containing In and Zn; an oxide containing In and Sn; and an oxide containing In.

4. The light-emitting device according to claim 1, wherein the amorphous oxide includes In, Zn and Ga.

5. The light-emitting device according to claim 1, wherein the light-emitting element and the field effect transistor are arranged on an optically transparent substrate, and a light emitted from the light-emitting layer is output through the substrate.

6. The light-emitting device according to claim 5, wherein the field effect transistor is arranged between the substrate and the light-emitting layer.

7. The light-emitting device according to claim 1, wherein the light-emitting element and the field effect transistor are arranged on an optically transparent substrate, and a light emitted from the light-emitting layer is output through the substrate and the amorphous oxide.

8. The light-emitting device according to claim 7, wherein the field effect transistor is arranged between the substrate and the light-emitting layer.

9. The light-emitting device according to claim 1, wherein at least one of the drain electrode of the field effect transistor and the second electrode is formed of an optically transparent electroconductive oxide.

10. The light-emitting device according to claim 1, wherein the light-emitting element is an electroluminescent element.

11. The light-emitting device according to claim 1, wherein a plurality of the light-emitting elements are arranged at least in a single row.

12. The light-emitting device according to claim 11, wherein the light-emitting element is arranged so as to be adjacent to the field effect transistor.

13. An electrophotographic device having
a photoreceptor,
an electrifier for electrifying the photoreceptor,
an exposing light source for exposing the photoreceptor in order to form a latent image on the photoreceptor, and
a developing unit for developing the latent image, wherein the exposing light source has the light-emitting device according to claim 11.

14. The electrophotographic device according to claim 13, wherein the amorphous oxide contains a group-IV element M4, wherein M4 is selected from the group consisting of Sn, Si, Ge, and Zr.

15. The light-emitting device according to claim 1, wherein the amorphous oxide contains a group-IV element M4, wherein M4 is selected from the group consisting of Sn, Si, Ge, and Zr.

16. The light-emitting device according to claim 1, wherein the amorphous oxide is an oxide which exhibits a halo pattern and no characteristic diffraction line in an x-ray diffraction spectrogram.

17. The light-emitting device according to claim 1, wherein the amorphous oxide has an electronic carrier concentration of less than $10^{16}/cm^3$.

18. The light-emitting device according to claim 1, wherein an electron mobility of the amorphous oxide increases when the electron carrier concentration increases.

19. A light-emitting device having a light-emitting element comprising first and second electrodes and a light-emitting layer existing between the first and second electrodes, and a field effect transistor for driving the light-emitting element, wherein an active layer of the field effect transistor comprises a transparent amorphous-oxide semiconductor having
(a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
(b) an electron carrier concentration of greater than $10^{12}/cm^3$ and lesser than $10^{18}/cm^3$, wherein the amorphous oxide semiconductor is capable of realizing a normally off state such that a current between a drain terminal and a source terminal of the field effect transistor when no gate voltage is applied is less than 10 microamperes; and
(c) oxygen defect density decreased by treatment in an atmosphere including oxygen at a predetermined pressure during or after formation of the active layer of the amorphous oxide.

20. The light-emitting device according to claim 1 or 18, wherein the light-emitting element and the field effect transistor are layered.

21. The light-emitting device according to claim 19, wherein the amorphous oxide contains a group-IV element M4, wherein M4 is selected from the group consisting of Sn, Si, Ge, and Zr.

22. The light-emitting device according to claim 19, wherein the amorphous oxide is an oxide which exhibits a halo pattern and no characteristic diffraction line in an x-ray diffraction spectrogram.

23. The light-emitting device according to claim 19, wherein the amorphous oxide has an electron carrier concentration of less than $10^{16}/cm^3$.

24. The light-emitting device according to claim 19, wherein an electron mobility of the amorphous oxide increases when the electron carrier concentration increases.

25. An active matrix display device comprising pixel circuits arranged into a two-dimensional matrix form, each of the pixel circuits comprising:
a light-emitting element comprising first and second electrodes and a light-emitting layer existing between the first and second electrodes; and
a field effect transistor for driving the light-emitting element, wherein an active layer of the field effect transistor includes such a transparent amorphous-oxide semiconductor having
(a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
(b) an electron carrier concentration of greater than $10^{12}/cm^3$ and lesser than $10^{18}/cm^3$, wherein the amorphous oxide semiconductor is capable of realizing a normally off state such that a current between a drain terminal and a source terminal of the field effect transistor when no gate voltage is applied is less than 10 microamperes; and
(c) oxygen defect density decreased by treatment in an atmosphere including oxygen at a predetermined pressure during or after formation of the active layer of the amorphous oxide.

26. The active matrix display device according to claim 23, wherein the light-emitting element and the field effect transistor are layered.

27. The active matrix display device according to claim 25, wherein the amorphous oxide contains a group-IV element M4, wherein M4 is selected from the group consisting of Sn, Si, Ge, and Zr.

28. The active matrix display device according to claim 25, wherein the amorphous oxide is an oxide which exhibits a halo pattern and no characteristic diffraction line in an x-ray diffraction spectrogram.

29. The active matrix display device according to claim 25, wherein the amorphous oxide has an electron carrier concentration of less than $10^{16}/cm^3$.

30. The light-emitting device according to claim 25, wherein an electron mobility of the amorphous oxide increases when the electron carrier concentration increases.

31. A display article comprising:
a light-emitting element comprising first and second electrodes and a light-emitting layer existing between the first and second electrodes and a field effect transistor for driving the light-emitting element, wherein an active layer of the field effect transistor includes an amorphous oxide semiconductor having
(a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
(b) an electron carrier concentration of greater than $10^{12}/cm^3$ and lesser than $10^{18}/cm^3$, wherein a current between a drain terminal and a source terminal of the field effect transistor when no gate voltage is applied is less than 10 microamperes; and
(c) oxygen defect density decreased by treatment in an atmosphere including oxygen at a predetermined pressure during or after formation of the active layer of the amorphous oxide.

32. The display article according to claim 31, wherein the amorphous oxide is any one selected from the group consisting of an oxide containing In, Zn and Sn; an oxide containing In and Zn; and oxide containing In and Sn; and an oxide containing In.

33. The display article according to claim 31, wherein the transistor is a normally-off type transistor.

34. The display article according to claim 31, wherein the light-emitting element and the field effect transistor are layered.

35. The display article according to claim 31, wherein the amorphous oxide contains a group-IV element M4, wherein M4 is selected from the group consisting of Sn, Si, Ge, and Zr.

36. The display article according to claim 31, wherein the amorphous oxide is an oxide which exhibits a halo pattern and no characteristic diffraction line in an x-ray diffraction spectrogram.

37. The display article according to claim 31, wherein the amorphous oxide has an electron carrier concentration of less than $10^{16}/cm^3$. line in an x-ray diffraction spectrogram.

38. The light-emitting device according to claim 31, wherein an electron mobility of the amorphous oxide increases when the electron carrier concentration increases.

39. A light-emitting device having a light-emitting element comprising first and second electrodes and a light-emitting layer existing between the first and second electrodes, and a field effect transistor for driving the light-emitting element, wherein an active layer of the field effect transistor comprises an amorphous-oxide of a compound having
(a) a composition selected from an oxide containing In, Ga, and Zn, an oxide containing In, Zn, and Sn, an oxide containing In and Sn, and an oxide containing In;
(b) an electron carrier concentration of greater than $10^{12}/cm^3$ and lesser than $10^{18}/cm^3$ wherein a current between a drain terminal and a source terminal of the field effect transistor when no gate voltage is applied is less than 10 microamperes; and
(c) an oxygen defect density decreased by treatment in an atmosphere including oxygen at a predetermined pressure during or after formation of the active layer of the amorphous oxide.

40. The light-emitting device according to claim 39, wherein the amorphous oxide is an oxide which exhibits a halo pattern and no characteristic diffraction line in an x-ray diffraction spectrogram.

41. The light-emitting device according to claim 39, wherein the amorphous oxide has an electron carrier concentration of less than $10^{16}/cm^3$.

42. The light-emitting device according to claim 39, wherein an electron mobility of the amorphous oxide increases when the electron carrier concentration increases.

43. A display article comprising:
a light-emitting element comprising first and second electrodes and a light-emitting layer existing between the first and second electrodes and a field effect transistor for driving the light-emitting element, wherein an active layer of the field effect transistor comprises an amorphous oxide of a compound having
(a) a composition selected from an oxide containing In, Ga, and Zn, an oxide containing In, Zn, and Sn, an oxide containing In and Sn, and an oxide containing In;
(b) an electron carrier concentration of greater than $10^{12}/cm^3$ and lesser than $10^{18}/cm^3$, wherein a current between a drain terminal and a source terminal of the field effect transistor when no gate voltage is applied is less than 10 microamperes; and
(c) an oxygen defect density decreased by treatment in an atmosphere including oxygen at a predetermined pressure during or after formation of the active layer of the amorphous oxide.

44. The display article according to claim 43, wherein the amorphous oxide is an oxide which exhibits a halo pattern and no characteristic diffraction line in an x-ray diffraction spectrogram.

45. The display article according to claim 43, wherein the amorphous oxide has an electron carrier concentration of less than $10^{16}/cm^3$.

46. The light-emitting device according to claim 43, wherein an electron mobility of the amorphous oxide increases when the electron carrier concentration increases.

47. A light-emitting device having a light-emitting element comprising first and second electrodes and a light-emitting layer existing between the first and second electrodes, and a field effect transistor for driving the light-emitting element, wherein an active layer of the field effect transistor comprises an amorphous oxide of a compound having
(a) a composition selected from an oxide containing In, Ga, and Zn, an oxide containing In, Zn, and Sn, an oxide containing In and Sn, and an oxide containing In;
(b) an electron carrier concentration of greater than $10^{12}/cm^3$ and lesser than $10^{18}/cm^3$, wherein the amorphous oxide semiconductor is capable of realizing a normally off state such that a current between a drain terminal and a source terminal of the field effect transistor when no gate voltage is applied is less than 10 microamperes; and
(c) an oxygen defect density decreased by treatment in an atmosphere including oxygen at a predetermined pressure during or after formation of the active layer of the amorphous oxide.

48. The light-emitting device according to claim 47, wherein the amorphous oxide is an oxide which exhibits a halo pattern and no characteristic diffraction line in an x-ray diffraction spectrogram.

49. The light-emitting device according to claim 47, wherein the amorphous oxide has an electron carrier concentration of less than $10^{16}/cm^3$.

50. The light-emitting device according to claim 47, wherein an electron mobility of the amorphous oxide increases when the electron carrier concentration increases.

51. An active matrix display device comprising pixel circuits arranged into a two-dimensional matrix form, each of the pixel circuits comprising:
 a light-emitting element comprising first and second electrodes; and
 a light-emitting layer existing between the first and second electrodes and a field effect transistor for driving the light-emitting element, wherein an active layer of the field effect transistor comprises an amorphous oxide of a compound having
 (a) a composition selected from an oxide containing In, Ga, and Zn, an oxide containing In, Zn, and Sn, an oxide containing In and Sn, and an oxide containing In;
 (b) an electron carrier concentration of greater than $10^{12}/cm^3$ and lesser than $10^{18}/cm^3$, wherein the amorphous oxide semiconductor is capable of realizing a normally off state such that a current between a drain terminal and a source terminal of the field effect transistor when no gate voltage is applied is less than 10 microamperes; and
 (c) an oxygen defect density decreased by treatment in an atmosphere including oxygen at a predetermined pressure during or after formation of the active layer of the amorphous oxide.

52. The active matrix display device according to claim 51, wherein the amorphous oxide is an oxide which exhibits a halo pattern and no characteristic diffraction line in an x-ray diffraction spectrogram.

53. The active matrix display device according to claim 51, wherein the amorphous oxide has an electron carrier concentration of less than $10^{16}/cm^3$.

54. The light-emitting device according to claim 51, wherein an electron mobility of the amorphous oxide increases when the electron carrier concentration increases.

* * * * *